United States Patent
Scott et al.

(10) Patent No.: US 6,625,550 B1
(45) Date of Patent: *Sep. 23, 2003

(54) ARC FAULT DETECTION FOR AIRCRAFT

(75) Inventors: Gary W. Scott, Mount Vernon, IA (US); Kon B. Wong, Cedar Rapids, IA (US)

(73) Assignee: Square D Company, Palatine, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/426,832

(22) Filed: Oct. 26, 1999

Related U.S. Application Data

(63) Continuation-in-part of application No. 09/129,685, filed on Aug. 5, 1998, now Pat. No. 6,259,996, which is a continuation-in-part of application No. 09/026,193, filed on Feb. 19, 1998, now Pat. No. 6,246,556

(60) Provisional application No. 60/128,640, filed on Apr. 9, 1999.

(51) Int. Cl.⁷ .................................................. H02H 3/10
(52) U.S. Cl. ............................ 702/58; 702/64; 702/69; 361/63; 361/87
(58) Field of Search ................ 702/57–59, 64–66, 702/69–76, 78, 79, 182–185, 190, 191, 193, 195, FOR 103, FOR 104, FOR 106–FOR 110, FOR 166; 700/292–294; 324/536, 520, 613, 614, 424, 521, 41–76, 522, 541, 544, 546, 547, 127; 361/42, 40, 113, 44, 45, 62, 63, 43, 46–50, 93, 6, 65, 78–80, 87, 89, 93.1, 94, 111, 119, 2, 5; 340/649, 650, 658, 659, 664, 635, 638, 647; 335/18, 201; 244/53 R, 60

(56) References Cited

U.S. PATENT DOCUMENTS 2,808,566 A  10/1957 Douma ....................... 324/127
2,832,642 A  4/1958 Lennox ....................... 299/132
2,898,420 A  8/1959 Kuze ............................ 200/87

(List continued on next page.)

FOREIGN PATENT DOCUMENTS

| CA | 2267490 | 3/1999 |
| CA | 2256208 | 6/1999 |
| CA | 2256243 | 6/1999 |

(List continued on next page.)

OTHER PUBLICATIONS

Paolantonio, Antonio N., P.E., Directional Couplers, R.F. Design, pp. 40–49 (Sep./Oct. 1979).

Duenas, Alejandro J. Directional Coupler Design Graphs For Parallel Coupled Lines And Interdigitated 3 dB Couplers, RF Design, pp. 62–64 (Feb. 1986).

RV4145 Low Power Ground Fault Interrupter, Preliminary Product Specifications Of Integrated Circuits, Raytheon Company Semiconductor Division, pp. 1–8 (no date).

Joubert, Jean–Francois, Feasibility Of Main Service Ground–Fault Protection On The Electrical Service To Dwelling Units, Consultants Electro–Protection Ins., pp. 1–77 (Oct. 26, 1990).

(List continued on next page.)

Primary Examiner—Hal Wachsman
(74) Attorney, Agent, or Firm—Kareem M. Irfan; Larry I. Golden

(57) ABSTRACT

An arc fault detector system detects arcing faults in an electrical distribution system by monitoring one or more conductors and producing an input signal representing one or more electrical signal conditions in the circuit to be monitored. This input signal is processed to develop signals representing the electrical current flow through the monitored circuit and broadband noise signal components. The system analyzes these signals to determine whether an arcing fault is present, and if so, outputs a trip signal which may be used directly or indirectly to trip a circuit breaker or other circuit interruption device.

21 Claims, 18 Drawing Sheets

U.S. PATENT DOCUMENTS

| | | | |
|---|---|---|---|
| 3,471,784 A | 10/1969 | Arndt et al. | 324/126 |
| 3,538,241 A | 11/1970 | Rein | 174/143 |
| 3,588,611 A | 6/1971 | Lambden et al. | 317/31 |
| 3,600,502 A | 8/1971 | Wagenaar et al. | 174/143 |
| 3,622,872 A | 11/1971 | Boaz et al. | 324/52 |
| 3,660,721 A | 5/1972 | Baird | 317/16 |
| 3,684,955 A | 8/1972 | Adams | 324/72 |
| 3,716,757 A | 2/1973 | Rodriguez | 317/40 R |
| 3,746,930 A | 7/1973 | Van Best et al. | 317/31 |
| 3,775,675 A | 11/1973 | Freeze et al. | 324/51 |
| 3,812,337 A | 5/1974 | Crosley | 235/153 AC |
| 3,858,130 A | 12/1974 | Misencik | 335/18 |
| 3,869,665 A | 3/1975 | Kenmochi et al. | 324/72 |
| 3,878,460 A | 4/1975 | Nimmersjo | 324/52 |
| 3,911,323 A | 10/1975 | Wilson et al. | 317/18 |
| 3,914,667 A | 10/1975 | Waldron | 317/36 |
| 3,932,790 A | 1/1976 | Muchnick | 317/18 D |
| 3,939,410 A | 2/1976 | Bitsch et al. | 324/72 |
| 4,052,751 A | 10/1977 | Shepard | 361/50 |
| 4,074,193 A | 2/1978 | Kohler | 324/126 |
| 4,081,852 A | 3/1978 | Coley et al. | 361/45 |
| 4,087,744 A | 5/1978 | Olsen | 324/51 |
| 4,156,846 A | 5/1979 | Harrold et al. | 324/158 |
| 4,166,260 A | 8/1979 | Gillette | 335/20 |
| 4,169,260 A | 9/1979 | Bayer | 340/562 |
| 4,214,210 A | 7/1980 | O'Shea | 455/282 |
| 4,233,640 A | 11/1980 | Klein et al. | 361/44 |
| 4,245,187 A | 1/1981 | Wagner et al. | 324/54 |
| 4,251,846 A | 2/1981 | Pearson et al. | 361/30 |
| 4,264,856 A | 4/1981 | Frierdich et al. | 322/25 |
| RE30,678 E | 7/1981 | Van Zeeland et al. | 361/44 |
| 4,316,187 A | 2/1982 | Spencer | 340/664 |
| 4,344,100 A | 8/1982 | Davidson et al. | 361/45 |
| 4,354,154 A | 10/1982 | Schiemann | 324/51 |
| 4,356,443 A | 10/1982 | Emery | 324/51 |
| 4,378,525 A | 3/1983 | Burdick | 324/127 |
| 4,387,336 A | 6/1983 | Joy et al. | 324/51 |
| 4,459,576 A | 7/1984 | Fox et al. | 336/84 |
| 4,466,071 A | 8/1984 | Russell, Jr. | 364/492 |
| 4,477,855 A | 10/1984 | Nakayama et al. | 361/54 |
| 4,587,588 A | 5/1986 | Goldstein | 361/54 |
| 4,616,200 A | 10/1986 | Fixemer et al. | 335/35 |
| 4,631,621 A | 12/1986 | Howell | 361/13 |
| 4,639,817 A | 1/1987 | Cooper et al. | 361/62 |
| 4,642,733 A | 2/1987 | Schact | 361/65.6 |
| 4,644,439 A | 2/1987 | Taarning | 361/87 |
| 4,652,867 A | 3/1987 | Masot | 340/638 |
| 4,658,322 A | 4/1987 | Rivera | 361/37 |
| 4,697,218 A | 9/1987 | Nicolas | 633/882 |
| 4,702,002 A | 10/1987 | Morris et al. | 29/837 |
| 4,707,759 A | 11/1987 | Bodkin | 831/642 |
| 4,723,187 A | 2/1988 | Howell | 361/13 |
| 4,771,355 A | 9/1988 | Emery et al. | 361/33 |
| H536 H | 10/1988 | Strickland et al. | 324/456 |
| H538 H | 11/1988 | Betzold | 89/134 |
| 4,810,954 A | 3/1989 | Fam | 324/142 |
| 4,816,958 A | 3/1989 | Belbel et al. | 361/93 |
| 4,833,564 A | 5/1989 | Pardue et al. | 361/93 |
| 4,835,648 A | 5/1989 | Yamauchi | 361/14 |
| 4,839,600 A | 6/1989 | Kuurstra | 324/127 |
| 4,845,580 A | 7/1989 | Kitchens | 361/91 |
| 4,847,719 A | 7/1989 | Cook et al. | 361/13 |
| 4,853,818 A | 8/1989 | Emery et al. | 361/33 |
| 4,858,054 A | 8/1989 | Franklin | 361/57 |
| 4,866,560 A | 9/1989 | Allina | 361/104 |
| 4,878,144 A | 10/1989 | Nebon | 361/96 |
| 4,882,682 A | 11/1989 | Takasuka et al. | 364/507 |
| 4,893,102 A | 1/1990 | Bauer | 335/132 |
| 4,901,183 A | 2/1990 | Lee | 361/56 |
| 4,922,368 A | 5/1990 | Johns | 361/62 |
| 4,931,894 A | 6/1990 | Legatti | 361/45 |
| 4,939,495 A | 7/1990 | Peterson et al. | 337/79 |
| 4,949,214 A | 8/1990 | Spencer | 361/95 |
| 4,969,063 A | 11/1990 | Scott et al. | 361/93 |
| 5,010,438 A | 4/1991 | Brady | 361/56 |
| 5,047,724 A | 9/1991 | Boksiner et al. | 324/520 |
| 5,051,731 A | 9/1991 | Guim et al. | 340/638 |
| 5,121,282 A | 6/1992 | White | 361/42 |
| 5,166,861 A | 11/1992 | Krom | 361/379 |
| 5,168,261 A | 12/1992 | Weeks | 340/515 |
| 5,179,491 A | 1/1993 | Runyan | 361/45 |
| 5,185,684 A | 2/1993 | Beihoff et al. | 361/45 |
| 5,185,685 A | 2/1993 | Tennies et al. | 361/45 |
| 5,185,686 A | 2/1993 | Hansen et al. | 361/45 |
| 5,185,687 A | 2/1993 | Beihoff et al. | 361/45 |
| 5,206,596 A | 4/1993 | Beihoff et al. | 324/536 |
| 5,208,542 A | 5/1993 | Tennies et al. | 324/544 |
| 5,223,795 A | 6/1993 | Blades | 324/536 |
| 5,224,006 A | 6/1993 | MacKenzie et al. | 361/45 |
| 5,257,157 A | 10/1993 | Epstein | 361/111 |
| 5,280,404 A | 1/1994 | Ragsdale | 361/113 |
| 5,286,933 A | 2/1994 | Pham | 218/119 |
| 5,307,230 A | 4/1994 | MacKenzie | 361/96 |
| 5,334,939 A | 8/1994 | Yarbrough | 324/424 |
| 5,353,014 A | 10/1994 | Carroll et al. | 340/638 |
| 5,359,293 A | 10/1994 | Boksiner et al. | 324/544 |
| 5,363,269 A | 11/1994 | McDonald | 361/45 |
| 5,373,241 A | 12/1994 | Ham, Jr. et al. | 324/536 |
| 5,383,084 A | 1/1995 | Gershen et al. | 361/113 |
| 5,388,021 A | 2/1995 | Stahl | 361/56 |
| 5,396,179 A | 3/1995 | Domenichini et al. | 324/546 |
| 5,412,526 A | 5/1995 | Kapp et al. | 361/56 |
| 5,414,590 A | 5/1995 | Tajali | 361/669 |
| 5,420,740 A | 5/1995 | MacKenzie et al. | 361/45 |
| 5,424,894 A | 6/1995 | Briscall et al. | 361/45 |
| 5,434,509 A | 7/1995 | Blades | 324/536 |
| 5,444,424 A | 8/1995 | Wong et al. | 335/172 |
| 5,446,431 A | 8/1995 | Leach et al. | 335/18 |
| 5,448,443 A | 9/1995 | Muelleman | 361/111 |
| 5,452,222 A | 9/1995 | Gray et al. | 364/481 |
| 5,452,223 A | 9/1995 | Zuercher et al. | 364/483 |
| 5,459,630 A | 10/1995 | MacKenzie et al. | 361/45 |
| 5,473,494 A | 12/1995 | Kurosawa et al. | 361/3 |
| 5,477,150 A | 12/1995 | Ham, Jr. et al. | 324/536 |
| 5,481,235 A | 1/1996 | Heise et al. | 335/18 |
| 5,483,211 A | 1/1996 | Carrodus et al. | 335/18 |
| 5,485,093 A | 1/1996 | Russell et al. | 324/522 |
| 5,493,278 A | 2/1996 | MacKenzie et al. | 340/638 |
| 5,499,189 A | 3/1996 | Seitz | 364/480 |
| 5,506,789 A | 4/1996 | Russell et al. | 364/492 |
| 5,510,946 A | 4/1996 | Franklin | 361/56 |
| 5,512,832 A | 4/1996 | Russell et al. | 324/522 |
| 5,519,561 A | 5/1996 | Mrenna et al. | 361/105 |
| 5,531,617 A | 7/1996 | Marks | 439/723 |
| 5,537,327 A | 7/1996 | Snow et al. | 364/483 |
| 5,546,266 A | 8/1996 | Mackenzie et al. | 361/93 |
| 5,561,605 A | 10/1996 | Zuercher et al. | 364/483 |
| 5,568,371 A | 10/1996 | Pitel et al. | 363/39 |
| 5,578,931 A | 11/1996 | Russell et al. | 324/536 |
| 5,590,010 A | 12/1996 | Ceola et al. | 361/93 |
| 5,590,012 A | 12/1996 | Dollar | 361/113 |
| 5,602,709 A | 2/1997 | Al-Dabbagh | 361/85 |
| 5,608,328 A | 3/1997 | Sanderson | 324/529 |
| 5,617,019 A | 4/1997 | Etter | 324/117 R |
| 5,638,244 A | 6/1997 | Mekanik et al. | 361/62 |
| 5,646,502 A | 7/1997 | Johnson | 320/5 |
| 5,657,244 A | 8/1997 | Seitz | 364/492 |
| 5,659,453 A | 8/1997 | Russell et al. | 361/93 |
| 5,661,645 A | 8/1997 | Hochstein | 363/89 |
| 5,682,101 A | 10/1997 | Brooks et al. | 324/536 |
| 5,691,869 A | 11/1997 | Engel et al. | 361/42 |

| | | | |
|---|---|---|---|
| 5,701,110 A | 12/1997 | Scheel et al. | 335/132 |
| 5,706,154 A | 1/1998 | Seymour | 361/42 |
| 5,726,577 A | 3/1998 | Engel et al. | 324/536 |
| 5,729,145 A | 3/1998 | Blades | 324/536 |
| 5,764,125 A | 6/1998 | May | 336/92 |
| 5,805,397 A | 9/1998 | MacKenzie | 361/42 |
| 5,805,398 A | 9/1998 | Rae | 361/42 |
| 5,815,352 A | 9/1998 | Mackenzie | 361/42 |
| 5,818,237 A | 10/1998 | Zuercher et al. | 324/536 |
| 5,818,671 A | 10/1998 | Seymour et al. | 361/42 |
| 5,825,598 A | 10/1998 | Dickens et al. | 361/42 |
| 5,834,940 A | 11/1998 | Brooks et al. | 324/424 |
| 5,835,319 A | 11/1998 | Welles, II et al. | 361/5 |
| 5,835,321 A | 11/1998 | Elms et al. | 361/45 |
| 5,839,092 A | 11/1998 | Erger et al. | 702/58 |
| 5,847,913 A | 12/1998 | Turner et al. | 361/93 |
| 5,886,861 A | 3/1999 | Parry | 361/42 |
| 5,889,643 A | 3/1999 | Elms | 361/42 |
| 5,896,262 A | 4/1999 | Rae et al. | 361/94 |
| 5,905,619 A | 5/1999 | Jha | 361/93 |
| 5,933,308 A | 8/1999 | Garzon | 361/62 |
| 5,946,179 A | 8/1999 | Fleege et al. | 361/93 |
| 5,986,860 A * | 11/1999 | Scott | 361/42 |
| 6,031,699 A | 2/2000 | Dollar, II et al. | 361/142 |
| 6,040,967 A | 3/2000 | DiSalvo | 361/142 |
| 6,052,046 A | 4/2000 | Ennis et al. | 335/202 |
| 6,084,756 A | 7/2000 | Doring et al. | 361/45 |
| 6,088,205 A * | 7/2000 | Neiger et al. | 361/42 |
| 6,191,589 B1 | 2/2001 | Clunn | 324/424 |
| 6,198,611 B1 | 3/2001 | Macbeth | 361/42 |
| 6,215,378 B1 | 4/2001 | Gibson et al. | 335/18 |
| 6,229,679 B1 | 5/2001 | Macbeth | 361/42 |
| 6,229,680 B1 | 5/2001 | Shea | 361/42 |
| 6,232,857 B1 | 5/2001 | Mason, Jr. et al. | 335/18 |
| 6,246,556 B1 | 6/2001 | Haun et al. | 361/42 |
| 6,259,996 B1 * | 7/2001 | Haun et al. | 702/58 |
| 6,300,766 B1 * | 10/2001 | Schmalz | 324/536 |

FOREIGN PATENT DOCUMENTS

| | | | |
|---|---|---|---|
| CA | 2277589 | 6/1999 | |
| CA | 2265204 | 12/1999 | |
| CA | 2305910 | 5/2000 | |
| CA | 2307812 | 10/2000 | |
| EP | 0094871 A1 | 5/1983 | |
| EP | 0615327 A2 | 9/1994 | H02H/1/00 |
| EP | 0649207 A1 | 4/1995 | |
| EP | 0748021 A1 | 12/1996 | |
| EP | 0762591 A2 | 3/1997 | |
| EP | 0802602 A2 | 10/1997 | |
| EP | 0813281 A2 | 12/1997 | |
| EP | 0974995 A2 | 1/2000 | |
| EP | 0981193 A2 | 2/2000 | |
| EP | 1005129 | 5/2000 | |
| GB | 2177561 A | 6/1985 | |
| GB | 2285886 A | 7/1995 | |
| JP | 1-158365 | 6/1989 | G01R/15/02 |
| WO | WO92/08143 | 5/1992 | |
| WO | WO 97/30501 | 8/1997 | |
| WO | WO00/11696 | 3/2000 | |
| WO | WO00/36623 | 6/2000 | |
| WO | WO00/39771 | 7/2000 | |
| WO | WO01/01536 | 1/2001 | |

OTHER PUBLICATIONS

Russell, B.D., Detection Of Arcing Faults On Distribution Feeders, Texas A & M Research Foundation, Final Report, pp. 1–B18 (Dec. 1982).

JP06308191, dated Apr. 11, 1994, Abstract only.

* cited by examiner

ARC FAULT DETECTION FOR AIRCRAFT

CROSS-REFERENCE TO RELATED APPLICATIONS

This application is a continuation-in-part of application Ser. No. 09/129,685, filed Aug. 5, 1998, now U.S. Pat. No. 6,259,996, which is a continuation-in-part of application Ser. No. 09/026,193, filed Feb. 19, 1998, now U.S. Pat. No. 6,246,556. This application claims the benefit of provisional application Ser. No. 60/128,640, filed Apr. 9, 1999, now abandoned.

FIELD OF THE INVENTION

The present invention relates to the protection of electrical circuits and, more particularly, to the detection of electrical faults of the type known as arcing faults in an is electrical circuit, and more particularly still to arcing fault detection in aircraft wiring.

BACKGROUND OF THE INVENTION

Aircraft power systems have historically differed from ground based power systems in several ways. The electrical systems in residential, commercial and industrial applications usually include a panelboard for receiving electrical power from a utility source. The power is then routed through protection devices to designated branch circuits supplying one or more loads. These overcurrent devices are typically circuit interrupters such as circuit breakers and fuses which are designed to interrupt the electrical current if the limits of the conductors supplying the loads are surpassed.

Circuit breakers are a preferred type of circuit interrupter because a resetting mechanism allows their reuse. Typically, circuit breakers interrupt an electric circuit due to a disconnect or trip condition such as a current overload or ground fault. The current overload condition results when a current exceeds the continuous rating of the breaker for a time interval determined by the trip current. A ground fault trip condition is created by an imbalance of currents flowing between a line conductor and a neutral conductor which could be caused by a leakage current or an arcing fault to ground.

Arcing faults are commonly defined as current through ionized gas between two ends of a broken conductor or at a faulty contact or connector, between two conductors supplying a load, or between a conductor and ground. However, arcing faults may not cause a conventional circuit breaker to trip. Arcing fault current levels may be reduced by branch or load impedance to a level below the trip curve settings of the circuit breaker. In addition, an arcing fault which does not contact a grounded conductor or person will not trip a ground fault protector.

There are many conditions that may cause an arcing fault. For example, corroded, worn or aged wiring, connectors, contacts or insulation, loose connections, wiring damaged by nails or staples through the insulation, and electrical stress caused by repeated overloading, lightning strikes, etc. These faults may damage the conductor insulation and cause the conductor to reach an unacceptable temperature.

The need for arc detection in aircraft has become increasingly clear. For example, wire arcing may be a factor in some aircraft fires. Past responses to aircraft fires have been to increase the flame retardant properties of wiring and other interior components of aircraft. Standard overcurrent devices used in circuit breakers respond to the heating effect of current in a resistive wire to "thermal trip" the breaker, but these do not respond to the sputtering arc currents which cause intense arc heating and fire.

We propose a better approach—to stop the arc when it happens rather than wait for a fire to start or for a circuit breaker to thermal trip.

Until recently, such arc detection capability has not been available in circuit breakers or relays. Arc detection has been available for 60 Hz residential, commercial or industrial systems, but has not heretofore been resolved for 400 Hz aircraft wiring systems. In addition, most aircraft circuits do not have the neutral return conductor found in 60 Hz systems. This prevents the use of differential detection of ground faults on most aircraft branch circuits. A standard aircraft circuit breaker contains bimetals and/or magnetic solenoids which provide an inverse time response to current. Arcing fault detection is not provided by these devices. Aircraft arc detection is not possible using arc detectors designed for 60 Hz circuits for several reasons. For example, 60 Hz arc detectors partly respond to ground fault which is not possible on standard aircraft branch circuits. Also, the methods used at 60 Hz cannot be automatically extended to cover a power frequency range as high as 400 Hz.

Circuit breakers have historically been the preferred protection for aerospace wiring. Present designs are based on technologies that are up to 40 years old. Advancements in electrical circuit protection introduced by the residential and commercial industries have been slow finding their way into aerospace applications. Ground Fault Circuit Interrupters (GFCI) for personnel protection have been available in the home since the early 1970's. Under ideal conditions, GFCI can detect phase to ground arcs as low as six milliamps, but cannot detect series arcs or improve line to neutral fault trip times.

Arc Fault detection technologies are a new and exciting innovation in circuit protection in the U.S. We have found that Arc Fault Circuit Interrupters (AFCI) can be designed to detect a series or parallel arc, as well as line to neutral arcs by "listening" for the unique signatures which arcs generate. We have found that AFCI can detect arc currents well below the trip curves of today's Mil-Spec aircraft circuit breakers. This enhanced detection capability may provide improved protection from arcing conditions onboard aircraft.

An arc fault circuit interrupter is a device intended to provide protection from the effects of arc faults by recognizing characteristics unique to arcing and by functioning to de-energize the circuit when an arc fault is detected.

Aircraft circuit breakers have historically been the best available protection for aerospace wiring. Today's design standards are based on technologies that are up to 40 years old. In aircraft/military type breakers, the protection is provided in two ways. Short circuit currents operate a magnetic trip latch, while overload currents operate either a bimetal trip latch or hydraulic damped magnetic plunger. The "instantaneous trip" is the high current magnetic trip action found on some but not all aircraft breakers. The time to trip during an overload is determined by the time it takes to heat a bimetal to the temperature that delatches the breaker. The more current that heats the bimetal, the shorter the time it takes to trip the breaker. A hydraulic-magnetic style of breaker contains a magnetic slug sealed in fluid which moves to a trip position in response to the square of the current. These circuit interruption devices are selected by aircraft design engineers to protect the aircraft wiring from overheating or melting. During arcing faults these currents are often small, short in duration and well below the over current time protection curve designed into these breakers. Recent events have brought these limitations in design and function to the forefront. "Electrical arcing failure" as the ignition source, has been suspected in several recent airline disasters.

We have discovered a way in which Arc Fault Circuit Interrupter (AFCI) technology can be applied to Alternating Current (AC) and may be applicable to Direct Current (DC) electrical power systems on aerospace vehicles. AFCI technology incorporates electronic circuits that can detect the arc signature, and differentiate it from normal load arcing (motor brushes, switch and relay contacts, etc.).

Arcing in a faulted AC circuit usually occurs sporadically in each half cycle of the voltage waveform. The complex arcing event causes sputtering arc's that vary the current from normal load patterns. The precurser to the arc may be a high resistance connection leading to a "glowing contact" and then a series arc, or a carbon track leading to line-to-line or parallel arcing. In a home circuit breaker equipped with Ground Fault Circuit Interrupter (GFCI), a carbon or moisture track can be detected early if the short is to ground. In many aircraft circuits, the neutral conductor is not available to complete the necessary ground fault detection circuit and GFCI protection is not possible. With the introduction of AFCI breakers, protection of arcing shorts from line-to-line, not involving ground, can also be detected and interrupted.

In our arc fault interrupter, the additional electronic devices monitor both the line voltage and current "signatures." In a normal operating circuit, common current fluctuations produce signatures which should not be mistaken for an arc. Starting currents, switching signatures and load changes (normal or "good arc" events) can be digitally programmed in the AFCI as normal signatures waveforms. Deviations or changes from these "normal" signatures are monitored by electronic circuits and algorithms to determine if arcing is occurring. When these arc fault signatures are recognized, the circuit is interrupted and power is removed. The speed of this detection as well as the arc magnitude can be programmable parameters at the time of manufacture. The particular signatures identified as arcs are part of the proprietary arc fault technology of Square D Company.

Commercial, UL approved AFCI circuit breakers are available commercially. These are now in the NEC and will be required in home bedroom circuits 2002. Since the electrical loads in residential circuits can vary widely, they will be designed to allow for almost an infinite combination of electrical loads. Their AFCI programming is combined with GFCI as well as magnetic and thermal overload components. They are designed to form fit and function in place of standard residential circuit breakers.

We have found that in principle, design and programming of AFCI devices for aerospace applications can be simpler than those of residential devices. The homeowner expects to be able to plug any load into an outlet without nuisance tripping from an AFCI. Contrast this with commercial aerospace applications where the loads on a given circuit are fixed by design. The load on each breaker is carefully planned. Deviations from the original OEM specifications require special analysis and FAA approval. Fixed loads coupled with standardized wiring practices, connectors and certifications reduce the circuit variations and make aircraft more similar to each other than one would expect. This, coupled with stable regulated power sources may allow for much faster reaction times or trip curves for AFCI devices designed for aerospace applications. In addition, 400 Hz AC power used in modern aircraft allows for more waveform comparisons in a given period of time: standard 60 Hz NEMA devices are designed to detect and arc fault in 7 cycles of power, (116.7 ms), at 400 Hz this takes only 17.5 ms. The increase of frequency coupled with more stable power, fixed loads, etc. indicate the devices should be well suited to prevent the electrical ignition source of aircraft fires. In the future, these devices may be board mounted in avionics power supplies and/or placed at individual electrical loads. They can be designed to communicate with one another or with data recorders to monitor the condition of electrical wiring and components. Maintenance data recorders can be reviewed after flight and pending failures identified and maintenance interventions can take place prior to system failure.

Laboratory tests have shown that AFCI breakers can detect faults not detectable by approved military aircraft circuit breakers and are significantly faster at detecting arcing faults in aircraft wiring.

Experiments were performed at International Aero Inc. with Schneider Electric, Square D Company to determine the differences between aircraft breakers and AFCI devices. These tests were based on the FAA Wet Arc Testing protocols developed to determine susceptibility of aircraft wire to arcing.

A five ampere rated (5A) Mil-Spec aircraft circuit breaker was placed in series with a fifteen ampere Square D Company Arc-D-Tect, AFCI, modified to operate at 400 Hz. Power was applied to an aircraft water boiler drawing 1.95 amps through the subject breaker and AFCI device. Arcs in the range of 75–100 amps were induced into the input to the boiler by dragging a 20 ga wire between input to the boiler to ground. In every test, the prototype AFCI interrupted the power before the Military-Standard aircraft breaker. These experiments indicate these devices can be adapted for use in aircraft AC circuits. Additional tests are ongoing to determine the detection differences with modified AFCI devices and standard aircraft circuit breakers, as well as the susceptibility of thermal acoustic insulation material to ignition from electrical arcs, and the ability of AFCI to mitigate the ignition.

There are two types of arcing faults in aircraft electrical circuits and wiring: Parallel and Series.

Parallel arcing occurs when there is an arc between two wires or wire-to-frame and the current is limited by the impedance of the voltage source, the wire, and the arc. When the fault is solidly connected and the arc voltage low, the normal aircraft breaker trips very quickly with little heating of the wire or damage at the arc point. Occasionally, however, the arc blows apart the faulted components creating a larger arc voltage and reducing the fault current below the trip curve and causing "ticking faults." The consequences of parallel arc damage, are usually much greater than series arcs. The average current may not be sufficient to trip a conventional breaker by heating the bimetal strip or the peak current may not be large enough to trigger the magnetic trip latch. This makes the Mil-Std breaker reasonably effective in protecting against parallel arcing when the peak current is a few hundred amps. Unfortunately, the fault current can be limited by a circuit with too much impedance to immediately trip the thermal-magnetic breaker. Parallel arcing is generally more hazardous than series arcing. The energy released in the arc is much higher with temperatures often in excess of 10,000 Deg. F. This causes pyrolyzation or charring of the insulation, creating conductive carbon paths and ejecting hot metal that is likely to encounter flammable materials.

Series arcing begins with corrosion in pin-socket connections or loose connections in series with the electrical loads. The voltage drop across a poor connection begins at a few hundred millivolts and slowly heats and oxidizes or pyrolizes the surrounding materials. The voltage drop increases to a few volts at which time it becomes a "glowing connection" and begins to release smoke from the surrounding polymer insulation. Series arc current is usually limited to a moderate value by the impedance of the electrical load that is connected to the circuit. The amount of power from series arc is typically far is less than in a parallel fault. Since the peak current is typically never greater than the design load current, series arcing is much more difficult to detect than parallel arcing. The signature of the series arc is an unusual variation of the normal load current. Series arcing is usually such that the arc current remains well below the trip curve of the Mil-Spec aircraft breaker. Loose terminal lugs, misarranged or cross-threaded electrical plugs, broken conductor strands inside a wire are typical sources. These arcs cause load voltage drops and heating of the wire, plug pin, or terminal lug. This heating can lead to component failure and ignition source. Direct Current (DC) arcs are another serious event that can potentially be prevented with AFCI technology. DC loads are relatively stable and any changes designed into a circuit tend to be well documented with known load profiles. Changes in the DC circuit signature should be detectable even faster than those in AC circuits. Without the sinusoidal changes in voltage and polarity as seen in AC power, changes in a DC circuit should be detected even more reliably than AC circuits.

Care needs to be taken in the adaptation of AFCI into aerospace. Critical and essential electrical circuits need protection which will not nuisance trip. Most aircraft electrical loads are on branched circuits which provide a mixture of current waveforms to the breaker. A single breaker in the cockpit may feed several unrelated systems. Nuisance tripping is not acceptable as several systems may be powered by one breaker. Careful analysis should be used in design and implementation of AFCI technology in aerospace. Even with these reservations, AFCI has the potential to be one of the single largest improvements to aircraft safety in years.

Summarizing briefly, heat, arcs or electrical ignition are often caused by loose connections, broken or shorted wires in the power distribution system. In aircraft wiring, vibration, moisture temperature extremes, improper maintenance and repair all contribute to wiring failure. This leads to arcing and may ignite combustible components. Furthermore, carbon tracking caused by heat generated by the arc can deteriorate the wire insulation, exposing the conductors and resulting in intermittent short circuits between individual wires. These inter-wire shorts can cause damage to delicate avionics and cause system malfunctions in-flight. Elimination or reduction of these hazards to flight with arc fault technology should become an industry-wide priority.

The invention includes an apparatus and method by which arcing is detected in aircraft wiring.

Detection of the above-described sputtering currents caused by arcing is one object of the present invention. A detection signal generated in accordance with the invention can be used to trip a circuit breaker, to indicate arcing to the avionics package, to alert the pilot, or to issue a command to release a control relay.

OBJECTS AND SUMMARY OF THE INVENTION

It is an object of the present invention to provide an arc fault detection system and method which reliably detects arc fault conditions which may be ignored by conventional circuit interrupters.

Another object of the invention is to provide an arc fault detection system which utilizes a minimum number of highly reliable electronic signal processing components, such as a microcontroller, to perform most of the signal processing and analyzing functions, so as to be relatively simple and yet highly reliable in operation.

Other and further objects and advantages of the invention will be apparent to those skilled in the art from the present specification taken with the accompanying drawings and appended claims.

In accordance with one aspect of the invention, there is provided a method of determining whether arcing is present in an aircraft electrical circuit comprising the steps of sensing a current in said circuit and developing a corresponding input signal, determining the presence of broadband noise in said input signal, and producing a corresponding output signal, and processing said input signal and said output signal in a predetermined fashion to determine whether an arcing fault is present in said circuit.

In accordance with another aspect of the invention, there is provided a system for determining whether arcing is present in an aircraft electrical circuit comprising a sensor for sensing a current in said circuit and developing a corresponding sensor signal, a circuit for determining the presence in the sensor signal of broadband noise, and producing a corresponding output signal, and a controller for processing said sensor signal and said output signal in a predetermined fashion to determine whether an arcing fault is present in said circuit.

In accordance with another aspect of the invention, there is provided a controller for determining whether arcing is present in an aircraft electrical circuit in response to input signals, said input signals corresponding to a current in said circuit and to the presence of broadband noise in a predetermined range of frequencies in said circuit, said controller including a plurality of counters and wherein said controller increments said plurality of counters in a predetermined fashion in accordance with said input signals and periodically determines whether an arcing fault is present based at least in part on the state of said plurality of counters.

In accordance with another aspect of the invention, there is provided a method of determining whether arcing is present in an aircraft electrical circuit by processing input signals corresponding to a current in said circuit and to the presence of broadband noise in a predetermined range of frequencies in said circuit, said method comprising the steps of incrementing a plurality of counters in a predetermined fashion in accordance with said input signals, and periodically determining whether an arcing fault is present based at least in part on the state of said plurality of counters.

In accordance with another aspect of the invention, there is provided an electrical fault detector for aircraft wiring which comprises a first band-pass filter circuit responsive to an input signal representative of an electrical signal condition in a circuit to be monitored, which passes a frequency signal comprising signal components of said input signal which fall within a first predetermined frequency band and AND circuit means which receives and ANDs the frequency signals from the first and second band-pass filter circuits.

In accordance with another aspect of the invention, there is provided an application specific integrated circuit which comprises a first band-pass filter circuit responsive to an input signal representative of a signal condition in a circuit to be monitored which passes a frequency signal comprising signal components of said input signal which fall within a first predetermined frequency band, a second band-pass filter circuit means responsive to said input signal which passes a frequency signal comprising signal components of said input signal which fall within a second predetermined frequency band, and AND circuit which receives and ANDs said frequency signals from said first and second band-pass filter circuits.

BRIEF DESCRIPTION OF THE DRAWINGS

In the drawings:

FIGS. 12 and 13 respectively show exemplary flow charts for self-test and start data acquisition routines of FIG. 7a.

DESCRIPTION OF ILLUSTRATIVE EMBODIMENTS

Figure 1:
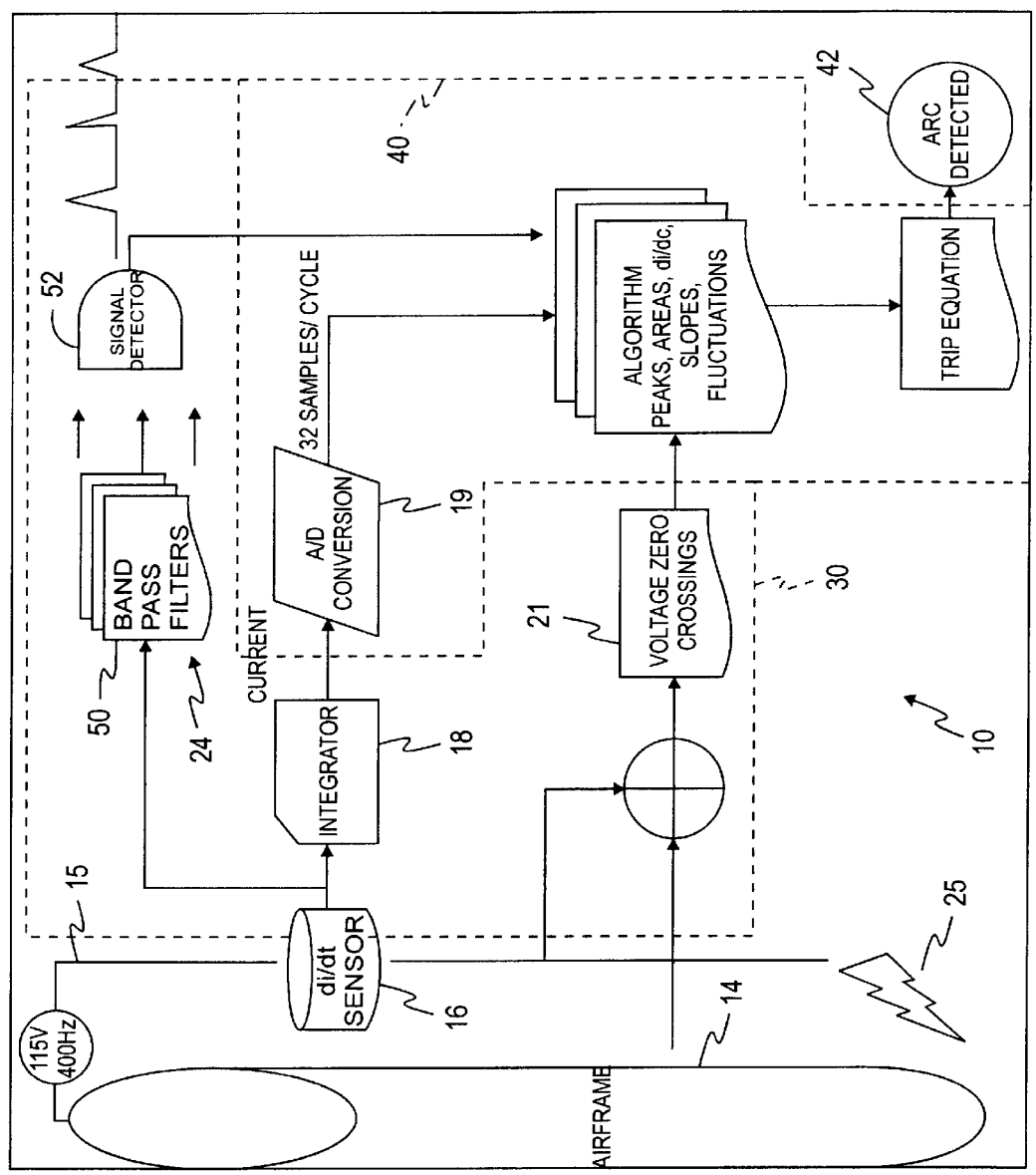
FIG. 1 is a functional block diagram of an arc fault detection system embodying the invention.
Figure 2:
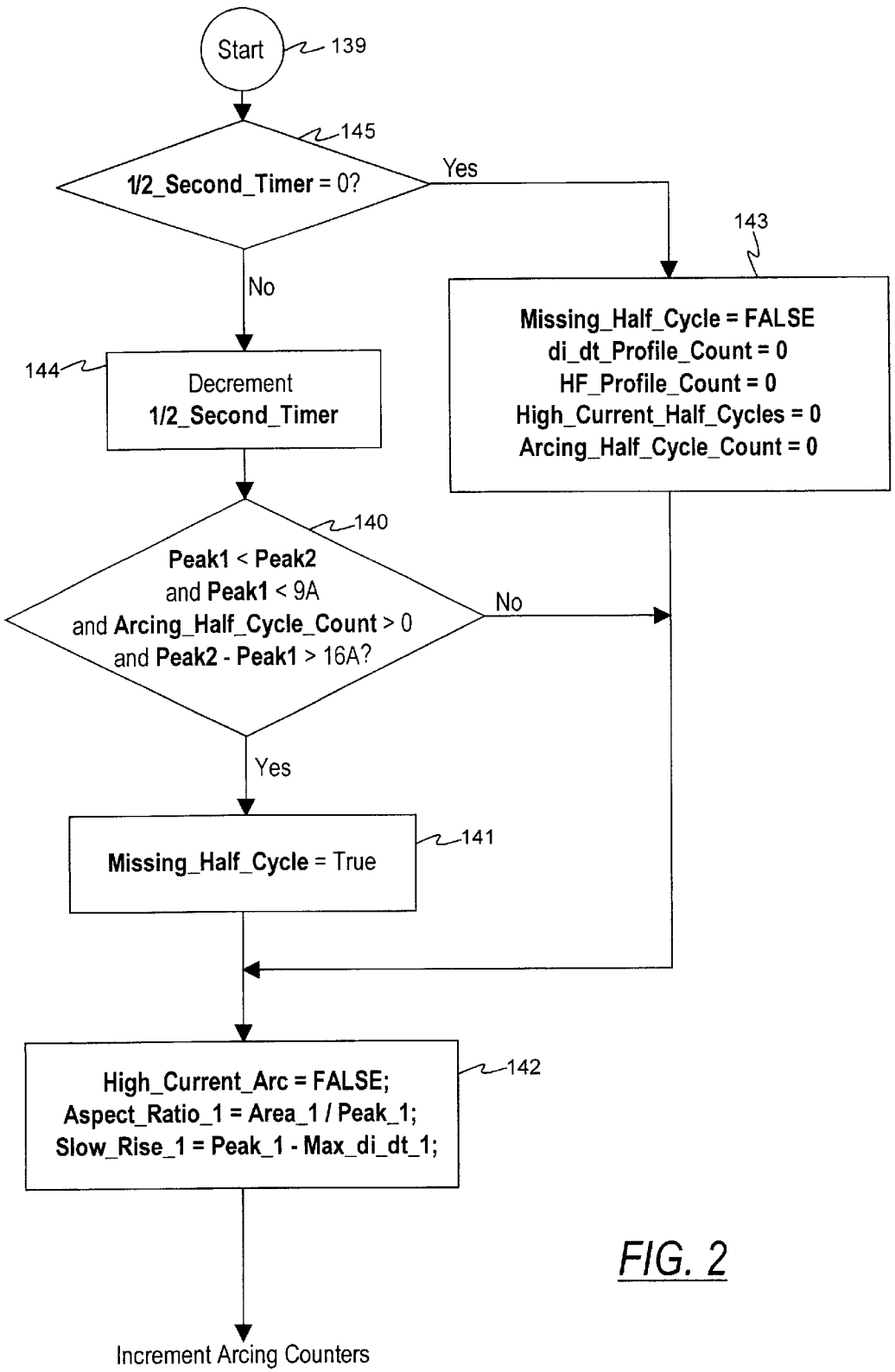
FIG. 2 is a flow chart of a routine which looks for a missing half cycle in a current being monitored, in accordance with one embodiment of the invention.
Figure 3:
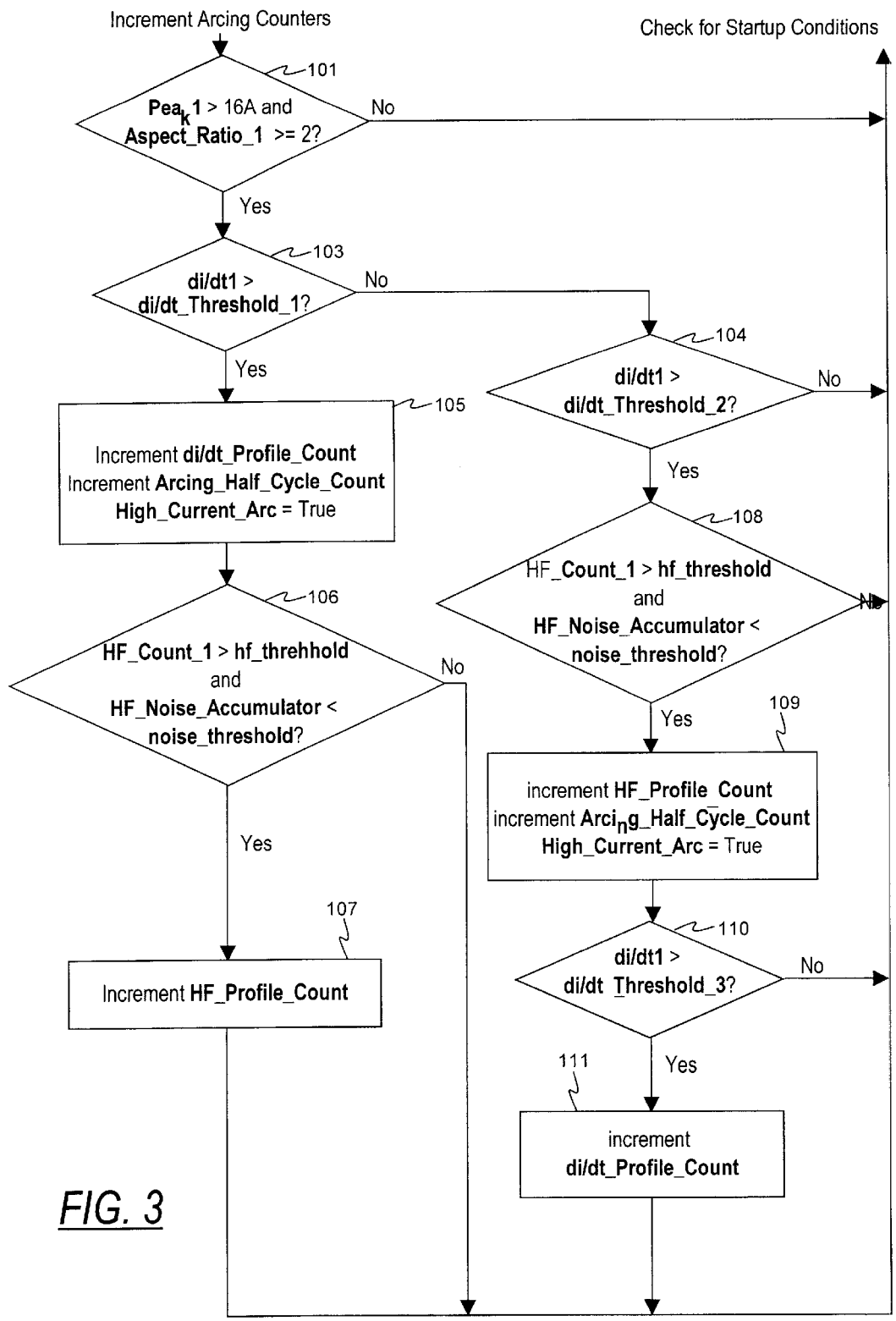
FIG. 3 is a flow chart showing a subroutine for the incrementing of arcing counters, in accordance with one embodiment of the invention.
Figure 4:
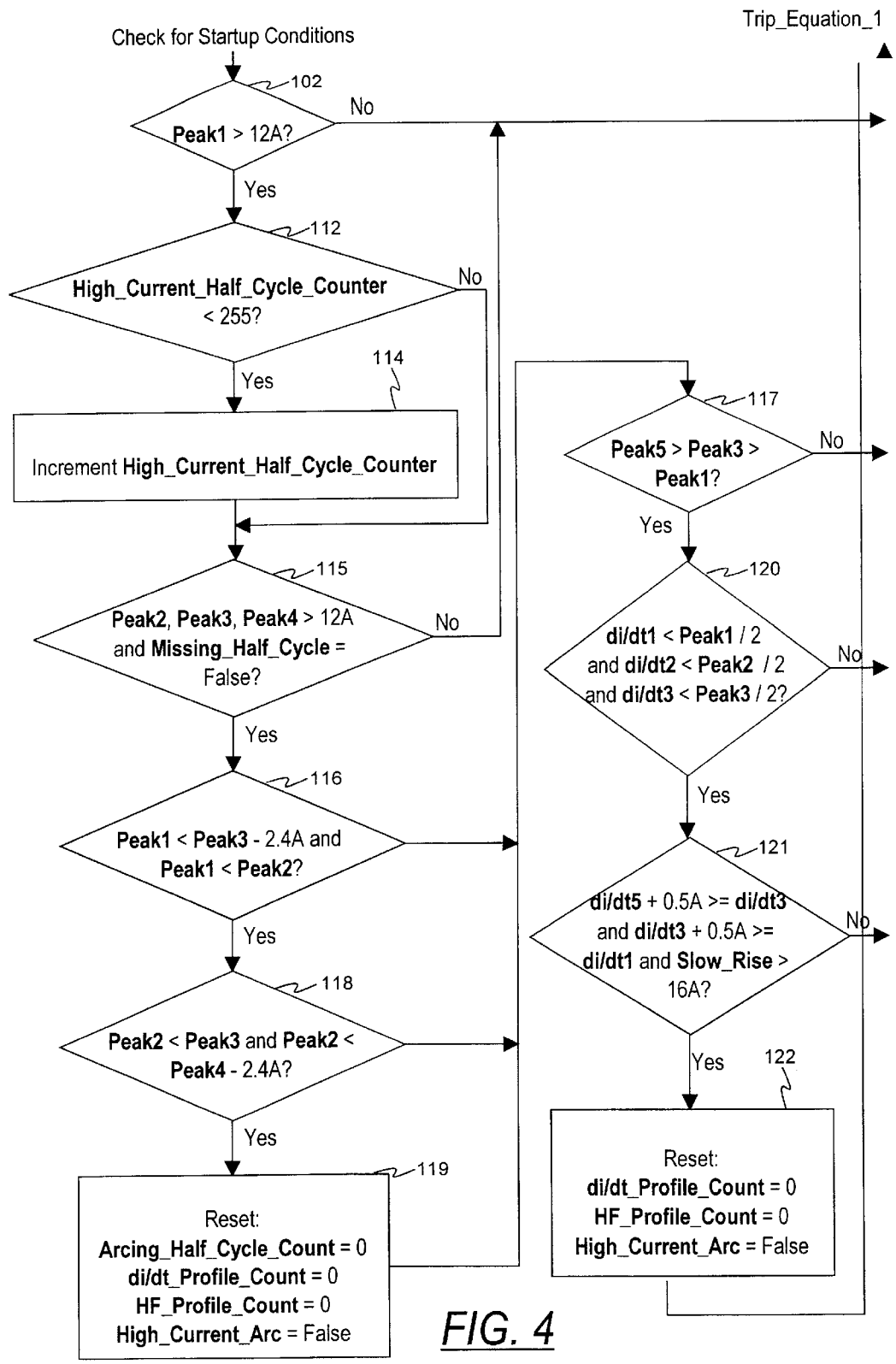
FIG. 4 is a flow chart illustrating a subroutine checking for start up conditions, in accordance with one embodiment of the invention.
Figure 5:
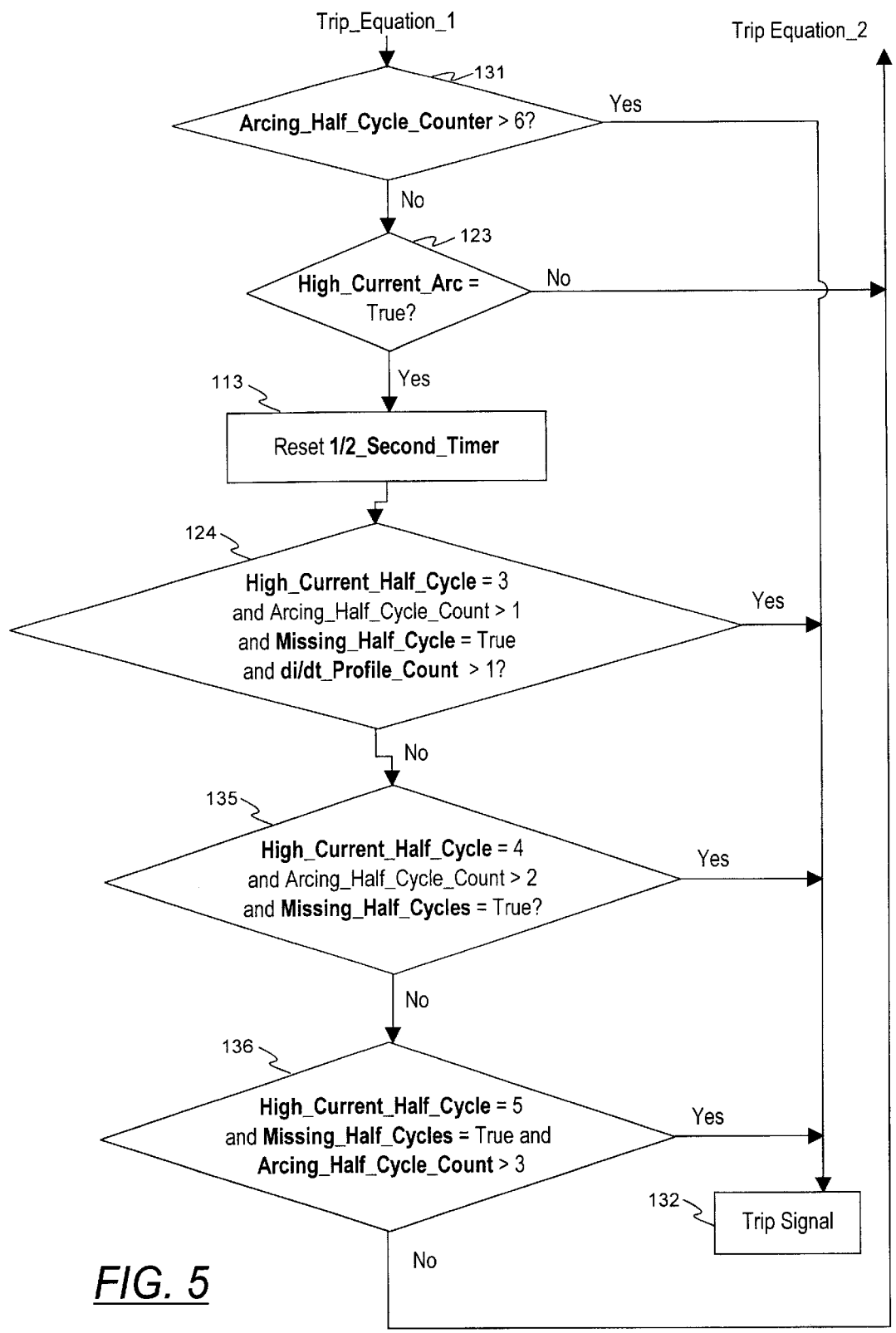
FIG. 5 is a flow chart illustrating a first trip equation subroutine, in accordance with one embodiment of the invention.
Figure 6A:
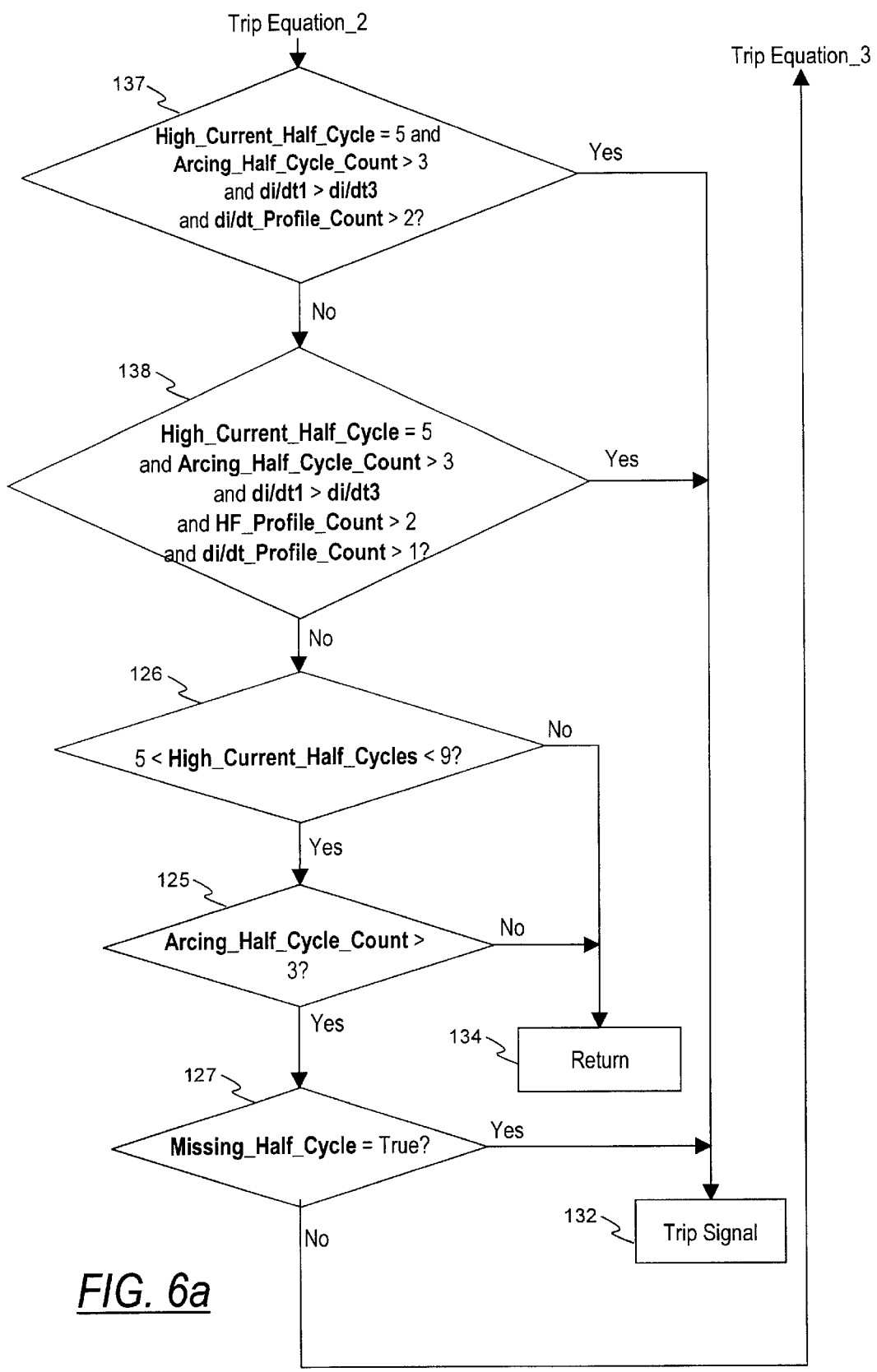
FIG. 6a is a flow chart illustrating a second trip equation subroutine; in accordance with one embodiment of the invention.
Figure 6B:
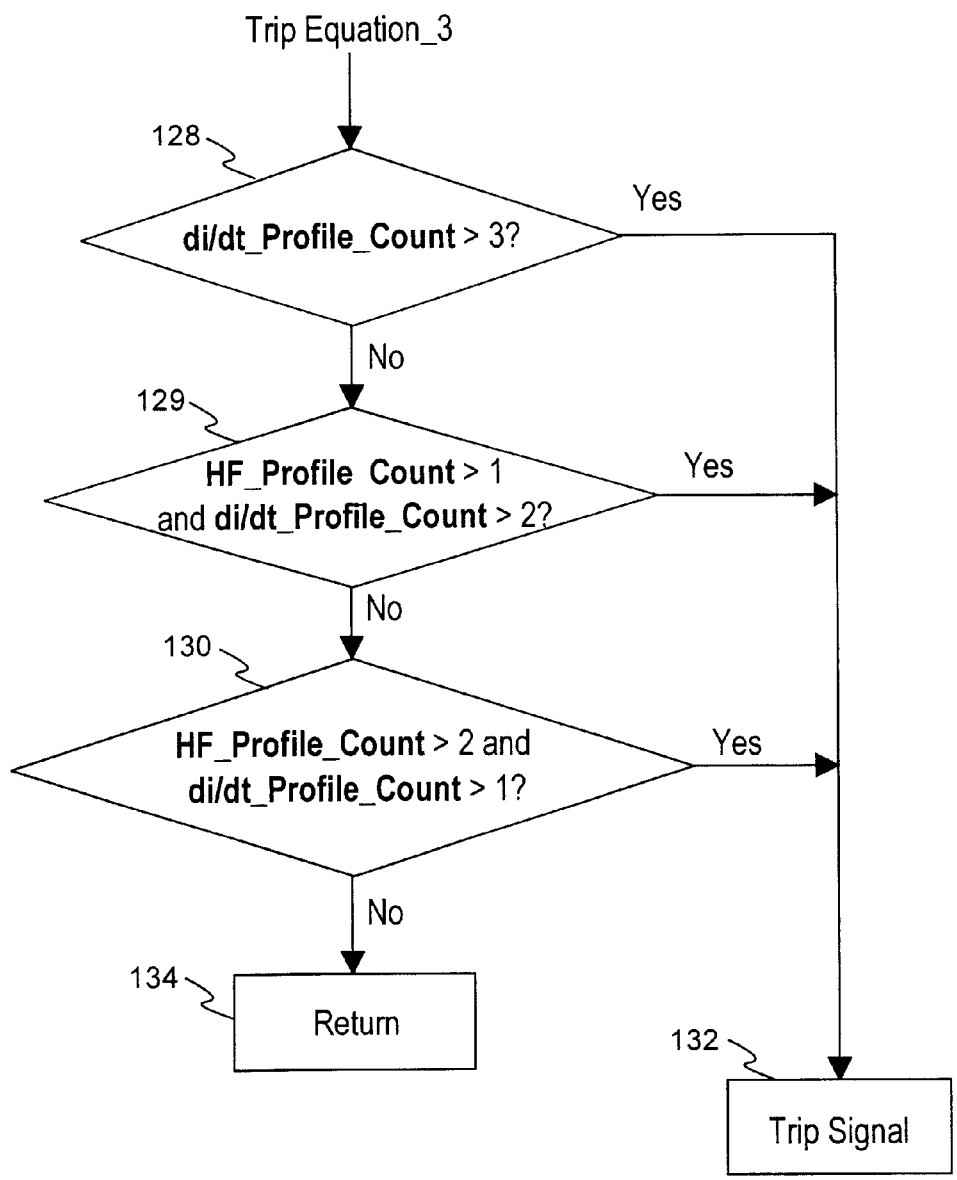
FIG. 6b is a flow chart illustrating a third trip equation subroutine, in accordance with one embodiment of the invention.

Referring now to the drawings and initially to FIG. 1, there is shown in block form a novel arcing fault detector system in accordance with the invention, and designated generally by the reference numeral 10. An arcing fault is indicated diagrammatically at reference numeral 25. In the illustrative example, the arcing fault detection system 10 is associated with an aircraft electrical system such as a 115 volt, 400 Hz circuit 15 which is to be monitored for arcing faults; however, the invention is not limited to use with a 400 Hz circuit. At least one sensor 16 is provided in association with the circuit 15 for producing a signal representative of a signal condition, such as power, voltage or current in the circuit 15. In the illustrated embodiment, this sensor 16 comprises a current rate of change sensor (di/dt). A monitored conductor 15 of the circuit 15 passes through the rate of change (di/dt) current sensor 16 which produces a signal representative of the rate of change of current flow in the conductor 15. The airframe 14 provides a return path for the aircraft electrical system.

The di/dt sensor 16 may comprise a toroidal coil having an annular core which surrounds the relevant conductor, with a toroidal sensing coil wound helically on the core. The core may be made of magnetic material such as ferrite, iron or molded permeable powder, such that the sensor is capable of responding to rapid changes in flux. An air gap may be cut into the core in certain instances to reduce the permeability, and the core material is such that it does not saturate during the relatively high current produced by some forms of arcing, so that arc detection is still possible.

The di/dt sensor 16 provides an input to an arcing fault detector circuit 24 which may include a broadband noise detector circuit, and to a current measuring circuit 26. In one embodiment, the components of the arcing fault circuit detector 24 and the current measuring circuit 26 are provided on an application specific integrated circuit (ASIC) 30. Suitable output signals from the ASIC 30 are fed to a microcontroller or microprocessor 40 (e.g., PIC16C73A) which, based on analysis and further processing of the signals provided by the ASIC 30 makes a decision as to whether to send a trip or "arc detected" s signal to an output 42. This trip signal may be used for activating a trip circuit (not shown) which may operate to remove 115V 400 Hz power from the circuit(s) in which arcing has been detected.

The broadband noise detector 24 comprises one or more band-pass filter circuits 50 which receive the rate of change of current signal from the di/dt sensor 16. The band-passes of these circuits 50 are selected to detect the presence of broadband noise in specific frequency bands, which may occur in the monitored circuits in the event of an arcing fault. Each of the band-pass filter circuits 50 feeds a filtered signal, comprising those components of an input signal from the di/dt sensor which fall within their respective band-pass frequency bands, to a signal detector circuit 52.

Further details of an ASIC and equivalent circuits which may be utilized may be found in the above-referenced copending application Ser. No. 09/026,193, filed Feb. 19, 1998, now U.S. Pat. No. 6,246,556.

During operation, the current in the monitored aircraft wire 15 generates a field which induces a voltage in the di/dt sensor 16. The voltage output of the sensor 16 is primarily proportional to the instantaneous rate of change of current. The calibration of the sensor 16 may be chosen to provide a signal in a range and frequency spectrum in which arcs can be most easily distinguished from loads. This range and spectrum may vary with the application but for aircraft, one useful range has been found to be from 100 to 150 k amps per second and one useful spectrum has been found to be from 100 Hz to 100 kHz. The output of the sensor 16 may also be a time-integration or integrator circuit 18. The integrator may be a passive resistor-capacitor circuit followed by an amplified integrator, the output of which is proportional to the AC current. The integrator 18 provides a signal to be sampled by an analog-to-digital A/D converter 19. In one embodiment, the output of the A/D converter 19 is a series of 8 bit (minimum) values representing the current at a rate of 16 samples per half cycle. The A/D converter may be a part of the microprocessor or microcontroller 40. As the frequency drifts from nominal, the time between voltage zero crossings, detected at a zero crossing detection circuit 21, is measured using internal timers and used to vary the sample rate to achieve a constant number of samples per cycle.

The circuit determines if there is simultaneously a trigger level signal in two or more frequency bands. In order to do this, a portion of the signal from the di/dt sensor 16 is routed to band-pass filters 50. The minimum number of band-pass filters is two. The frequency bands of the filters are chosen across the spectrum from 10 kHz to 100 kHz. In one example, for a two band implementation, the center frequencies are 30 kHz and 60 kHz. In this example, the output signals from the band-pass filters 50 are detected (rectified) and filtered with a low pass filter with a corner frequency of 5 kHz. The signal output of each frequency band is routed to a comparator (signal detector) 52, where it is compared with a reference voltage level, and, if sufficient, causes an output pulse. The "trigger level" of the signal from each band required to produce an output pulse from the comparator is determined by analyzing the nonarcing load-generated signature of the application. Additional comparators (AND gates) are used to send a pulse whenever multiple filter bands simultaneously receive a triggering signal in their band. The resulting pulses indicating signal acquisition in multiple bands are counted by the microprocessor 40 and used in some arc detection algorithms. The current samples are converted into current_peak, current_area, max(di/dt). These values are stored for each half cycle of voltage.

The use of the terms "band-pass filter," "comparator," "AND gate," and "Integrator" does not limit the invention to hardware equivalents of these devices. Software equivalents of these functions can be implemented, provided the di/dt signal (from sensor 16) is first amplified and converted to digital values.

In the illustrative embodiment, a voltage sensor (not shown) is implemented as a resistor divider which provides an attenuated voltage level compatible with the solid state logic devices. The zero crossing circuit 21 is implemented with a low pass filter (corner frequency 1 kHz) and comparators to provide a digital "1" when the voltage is above zero and a digital "0" when the voltage is below zero volts. The microcontroller 40 accepts the logic levels and incorporates timers to determine if the system frequency has increased or decreased from the previous cycle. The A/D sample rate is then adjusted faster or slower to maintain 33+/−1 samples per cycle.

The flow charts of FIGS. 2–6 illustrate a method of arc detection which may be carried out by the circuits and processor of FIG. 1.

Input signals available include:

16 samples (1 byte each) of current per half cycle of voltage. (1 bit=0.2 amps instantaneous, in the illustrative example.)

A logic level pulse indicating the polarity of the voltage with transitions occurring at voltage-zero.

A pulse train indicating simultaneous occurrences of di/dt signal in two frequency bands (one pulse=simultaneous current signals in both 30 khz and 60 khz band for at least 20 usec, in the illustrative example.)

In FIGS. 2–6b:

| | |
|---|---|
| Peak1 = | Peak of previous half cycle |
| Peak2 = | Peak of two previous half cycle ago |
| Peak3 = | Peak of three previous half cycle ago |
| Peak4 = | Peak of four previous half cycle ago |
| Peak5 = | Peak of five previous half cycle ago |
| di/dt1 = | Max di/dt of previous half cycle |
| di/dt2 = | Max di/dt of two previous half cycles ago |
| di/dt3 = | Max di/dt of three previous half cycles ago |
| di/dt4 = | Max di/dt of four previous half cycles ago |
| di/dt5 = | Max di/dt of five previous half cycles ago |
| di/dt_Threshold_1 = | .25 (peak) |

-continued

| | |
|---|---|
| di/dt_Threshold_2 = | .17 (peak) |
| di/dt_Threshold_3 = | .20 (peak) |
| Noise_Threshold = | 16 |
| HF_Threshold = | 4 |
| Aspect_Ratio_1 = | Area_1/Peak_1 |
| Slow_Rise = | Peak1−Max_di/dt1 |
| HF_Count_1 = | High frequency count from last ½ cycle |

This invention takes current waveforms and broadband noise to determine if arcing is present in electrical conductors. A high current arc is identified as a current waveform that has fast changes in current (di/dt) with or without broadband noise (10 kHz to 100 kHz, in one embodiment) depending on the level of di/dt. Table 1 summarizes high current arcing characteristic of current waveforms and how firmware counters are incremented in one embodiment. A detailed description of how the counters are used to determine if an arc is present or if it is normal load noise is described later.

Conditions exist where loads have broadband noise, large di/dt and high currents under normal operating conditions. To distinguish between normally noisy load currents and arcing currents, the method and apparatus of the invention responds to predefined levels of di/dt, broadband noise, high currents, decaying currents and current aspect ratios.

Broadband noise is the product of logical ANDing two frequency bands in hardware (not limited to two). If both are present simultaneously then a pulse is received at the microcontroller input. The pulses are counted every half cycle, stored and is reset to detect the frequency components in the next half cycle.

Definition of Terms and Variables

In one embodiment of the invention:

di/dt_Threshold_1—The threshold value is: 0.25×(peak current). If within a half cycle, the di/dt exceeds this threshold, the probability of the presence of an arc is high.

di/dt_Threshold_2—The threshold value is: 0.17×(peak current). If within a half cycle, the di/dt exceeds this threshold and broadband noise is present with low normal operating noise (HF_Noise_Accumulator<Noise_Threshold), the probability of the presence of an arc is high.

di/dt_Threshold_3—The threshold value is: 0.20×(peak current). If within a half cycle, the di/dt exceeds this threshold and broadband noise is present with low normal operating noise (HF_Noise_Accumulator<Noise_Threshold), the probability of the presence of an arc is high.

Noise_Threshold—The threshold value is: 16. This is the normal operating broadband noise (HF_Noise_Accumulator) threshold. The method and apparatus of the invention use this to determine if the broadband noise is due to arcing or from normal operation of loads.

HF_Count_1—Integer counter that contains the broadband noise count of the previous half cycle. The higher the count the greater the amplitude of broadband noise.

HF_Threshold—The threshold value is: 4. This threshold is the broadband noise count threshold due to arcing, if the broadband noise count (HF_Count_1) is greater than this threshold and the normal operating broadband noise counter (HF_Noise_Accumulator) is less than the Noise_Threshold, then the probability of an arc is high.

| | |
|---|---|
| Aspect_Ratio_1 - | Defined as Area_1/Peak_1. |
| Slow_Rise - | Defined as Peak1 − di/dt1 |
| Peak0 - | Peak current of present half cycle |
| Peak1 - | Peak current of previous half cycle |
| Peak2 - | Peak current of two previous half cycle ago |
| Peak3 - | Peak current of three previous half cycle ago |
| Peak4 - | Peak current of four previous half cycle ago |
| Peak5 - | Peak current of five previous half cycle ago |
| di/dt0 - | Max di/dt** of present half cycle |
| di/dt1 - | Max di/dt** of previous half cycle |
| di/dt2 - | Max di/dt** of two previous half cycles ago |
| di/dt3 - | Max di/dt** of three previous half cycles ago |
| di/dt4 - | Max di/dt** of four previous half cycles ago |
| di/dt5 - | Max di/dt** of five previous half cycles ago |
| area0 - | area* of present half cycle |
| area1 - | area* of last half cycle |
| di/dt_Profile_Count - | Holds the integer number of times di/dt has exceeded set thresholds as specified in TABLE 1. |
| High_Current_Half_Cycle - | Holds the integer number of half cycles greater than 16A peak. |
| Arcing_Half_Cycle_Count - | Holds the integer number of times an arcing half cycle was detected. Arcing half cycle described in TABLE 1. |
| HF_Count_1 - | Holds the integer number of counts of broadband noise from the previous half cycle. |
| HF_Profile_Count - | Holds the integer number of accumulated counts of broadband noise from previous half cycles. |
| HF_Noise_Accumulator - | Holds the integer number of high frequency counts during startup or steady state (currents less than 16A). |
| Missing_Half_Cycle - | Boolean variable set to TRUE when non-arcing follows arcing half cycle. | di/dt_Profile_Count—Holds the integer number of times di/dt has exceeded set thresholds as specified in TABLE 1.

High_Current_Half_Cycle—Holds the integer number of half cycles greater than 16A peak.

Arcing_Half_Cycle_Count—Holds the integer number of times an arcing half cycle was detected. Arcing half cycle described in TABLE 1.

HF_Count_1—Holds the integer number of counts of broadband noise from the previous half cycle.

HF_Profile_Count—Holds the integer number of accumulated counts of broadband noise from previous half cycles.

HF_Noise_Accumulator—Holds the integer number of high frequency counts during startup or steady state (currents less than 16A).

Missing_Half_Cycle—Boolean variable set to TRUE when non-arcing follows arcing half cycle.

TABLE 1

(each row characterizes an arcing half cycle)

| peak | di/dt (dt = 78us) | high | arcing | di/dt | HF profile |
|---|---|---|---|---|---|
| current with aspect ratio > 2 | | fre- quency broad band noise | half cycle count | profile count | count |
| >16A | >0.250xpeak current | not required | increment | increment | unchanged |
| >16A | >0.125xpeak current | required | increment | unchanged | increment |
| >16A | >0.200xpeak current | required | increment | increment | increment | wherein:

area is the sum of the values of the 16 samples per half cycle.

Max di/dt is the maximum difference between samples of the current for the rising edge. dt is the time between every sample of the current waveform. This sample time varies dynamically with the line frequency to get better coverage of the current waveform up to 400±50 Hz.

High frequency broadband noise is the presence of broadband noise during arcing.

The following Algorithms have been scaled for 5A Arc Detection, in accordance with one embodiment of the invention. The reference numerals in parentheses correspond to the reference numerals found in the flow charts of FIGS. 2–7.

In this embodiment, Boolean variables are set as follows:

Missing_Half_Cycle (141) is set to TRUE if all the following conditions are met (FIG. 2):
   (140)
   Peak1 < Peak2
   Peak1 > 9A
   Arcing_Half_Cycle_Count > 0
   Peak2-Peak1 > 16A High_Current_Arc (105, 109) is set to TRUE if all the following conditions are met:
   (101)
   Peak1 > 16A
   Aspect_Ratio_1 >= 2
   (103)
   di/dt1 > di/dt_Threshold_1
   Or
   (101)
   Peak1 < Peak2
   Peak1 > 9A
   (104)
   di/dt1 > di/dt_Threshold_2
   (108)
   HF_Count_1 > HF_Threshold
   HF_Noise_Accumulator < Noise_Threshold Algorithm counters are incremented and cleared under the following conditions (FIG. 3):
   (101)
   If (Peak1 > 16A and Slow_Rise > 2) then check the following:
     Increment di/dt_Profile_Count (105,111) if all the following are met:
       (103)
       di/dt1 > di/dt Threshold_1
       Or
       (104)
       di/dt1 > di/dt Threshold_2
       (110)
       di/dt1 > di/dt_Threshold_3
       (108)
       HF_Count_1 > HF_Threshold
       HF_Noise_Accumulator < Noise_Threshold
     Increment HF_Profile_Count (107, 109) if all the following -continued

```
  are met:
    (103)
      di/dt1 > di/dt Threshold_1
    (106)
      HF_Count_1 > HF_Threshold
      HF_Noise_Accumulator < Noise_Threshold
    Or
    (104)
      di/dt1 > di/dt_Threshold_2
    (108)
      HF_Count_1 > HF_Threshold
      HF_Noise_Accumulator < Noise_Threshold
  Increment Arcing_Half_Cycle_Count (105, 109) if all the
  following are met:
    (103)
      di/dt1 > di/dt Threshold_1
    Or
    (104)
      di/dt1 > di/dt_Threshold_2
    (108)
      HF_Count_1 > HF_Threshold
      HF_Noise_Accumulator < Noise_Threshold
Start-up Conditions (FIG. 4):
  Tungsten lamp startup
    (102, 115)
    If (Peak1 > 12 A and Peak2 > 12A and Peak3 > 12A and
    Peak 4 > 12A and Missing_Half_Cycle = FALSE) then
    check the following:
      (116, 118)
      If (((Peak1 < (Peak3-2.4A)) and (Peak1 < Peak2))and
      ((Peak2 < Peak3) and (Peak2 < Peak4-2.4A)))
      Then reset:
        - Arcing_Half_Cycle_Count = 0
        -di/dt_Profile_Count = 0
        -HF_Profile_Count = 0
        -High_Current_Arc = FALSE
  Inductive load startup
    (102, 115)
    If(Peak1 > 12A and Peak2 > 12A and Peak3 > 12A and
    Peak 4 > 12A and Missing_Half_Cycle = FALSE)
    then check the following:
      (117, 120, 121)
      ((Peak3 > Peak1) and (Peak 5 > Peak3) and (di/dt1 <
      Peak1/2) and (di/dt2 < Peak2/2) and (di/dt3 < Peak3/2)
      and ((di/dt5 + 0.5A) >= di/dt3) and ((di/dt3 + 0.5A) >=
      di/dt1) and (Slow_Rise > 16A))
      Then reset:
        -di/dt_Profile_Count = 0
        -HF_Profile_Counter = 0
        -High_Current_Arc = FALSE
```

If (no arcing half cycle in 0.5 seconds after last arcing half cycle, then clear all counters) A line to neutral or line to ground arc fault is present under the following conditions of the above firmware counters (FIG. 5):

```
TRIP (Trip Signal 132) IF:
  (131)
  If (Arcing_Half_Cycle_Count > 6)
  Or
  (124)
  If (High_Current_Half_Cycles = 3 within 0.5 seconds and
  Missing_Half_Cycle = TRUE and di/dt_Profile_Count > 1 and
  Arcing_Half_Cycle_Count > 1)
  Or
  (135)
  If (High_Current_Half_Cycles = 4 within 0.5 seconds and
  Missing_Half_Cycle = TRUE and high Arcing_Half_Cy-
  cle_Count >2)
  Or
  (136)
  If (High_Current_Half_Cycles = 5 within 0.5 seconds and
  Missing_Half_Cycle = TRUE and Arcing_Half_Cy-
  cle_Count > 3)
```

-continued

```
  Or (FIG. 6a)
  (137)
  If (High_Current_Half_Cycles = 5 within 0.5 seconds and
  Arcing_Half_Cycle_Count > 3 and di/dt1 > di/dt3 and
  di/dt_Profile_Count > 2)
  Or
  (138)
  If (High_Current_Half_Cycles = 5 within 0.5 seconds and
  Arcing_Half_Cycle_Count > 3 and di/dt1 > di/dt3 and HF_Pro-
  file_Count > 2 and di/dt_Profile_Count > 1)
  Or
  (126, 125, 127)
  If(5 < High_Current_Half_Cycles < 9 within 0.5 seconds and
  Arcing_Half_Cycle_Count > 3 and Missing_Half_Cycle =
  TRUE)
  Or
  (126, 125, 128) (FIG. 6b)
  If(5 < High_Current_Half_Cycles < 9 within 0.5 seconds and
  Arcing_Half_Cycle_Count > 3 and di/dt_Profile_Count > 3)
  Or
  (126, 125, 129)
  If(5 < High_Current_Half_Cycles < 9 within 0.5 seconds and
  Arcing_Half_Cycle_Count > 3 and HF_Profile_Count > 1 and
  di/dt_Profile_Count > 2)
  Or
  (126, 125, 130)
  If(5 < High_Current_Half_Cycles < 9 within 0.5 seconds and
  Arcing_Half_Cycle_Count > 3 and HF_Profile_Count > 2
  and di/dt_Profile_Count > 1)
```

Referring now to FIGS. 7a–13, the illustrated flow charts show an example of microprocessor overhead and set-up routines for the microprocessor 40 of FIG. 1, in one embodiment. These flow charts are one example only of microprocessor set-up, and are not intended to in any way limit the invention. Rather, the invention is directed to the detection of arcing faults in a circuit as described hereinabove, and as illustrated in connection with FIGS. 1–6, which show one embodiment of such an arc detection system for use in aircraft.

Figure 7A:
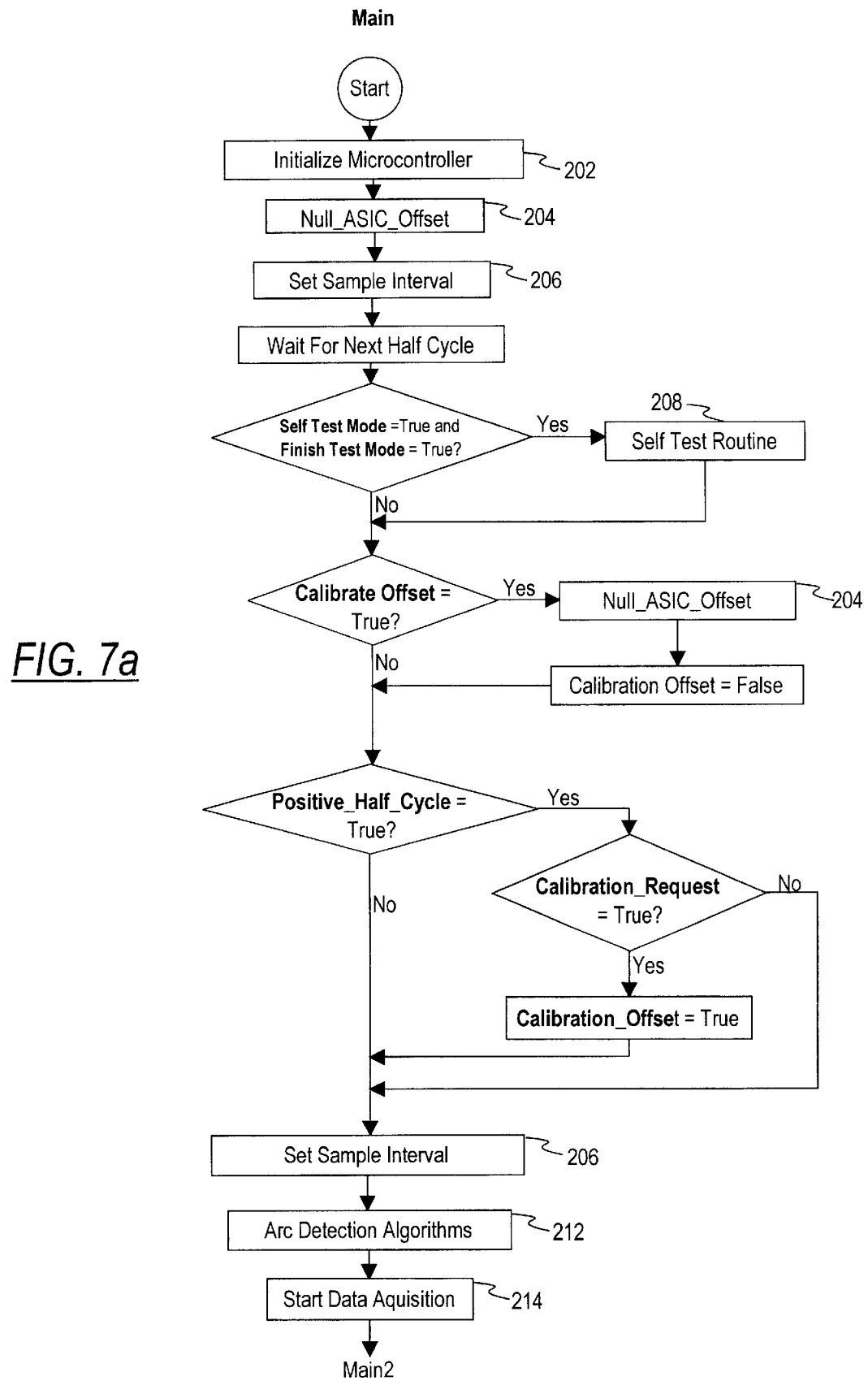
FIGS. 7a and 7b illustrate a main microcontroller routine.
Figure 7B:
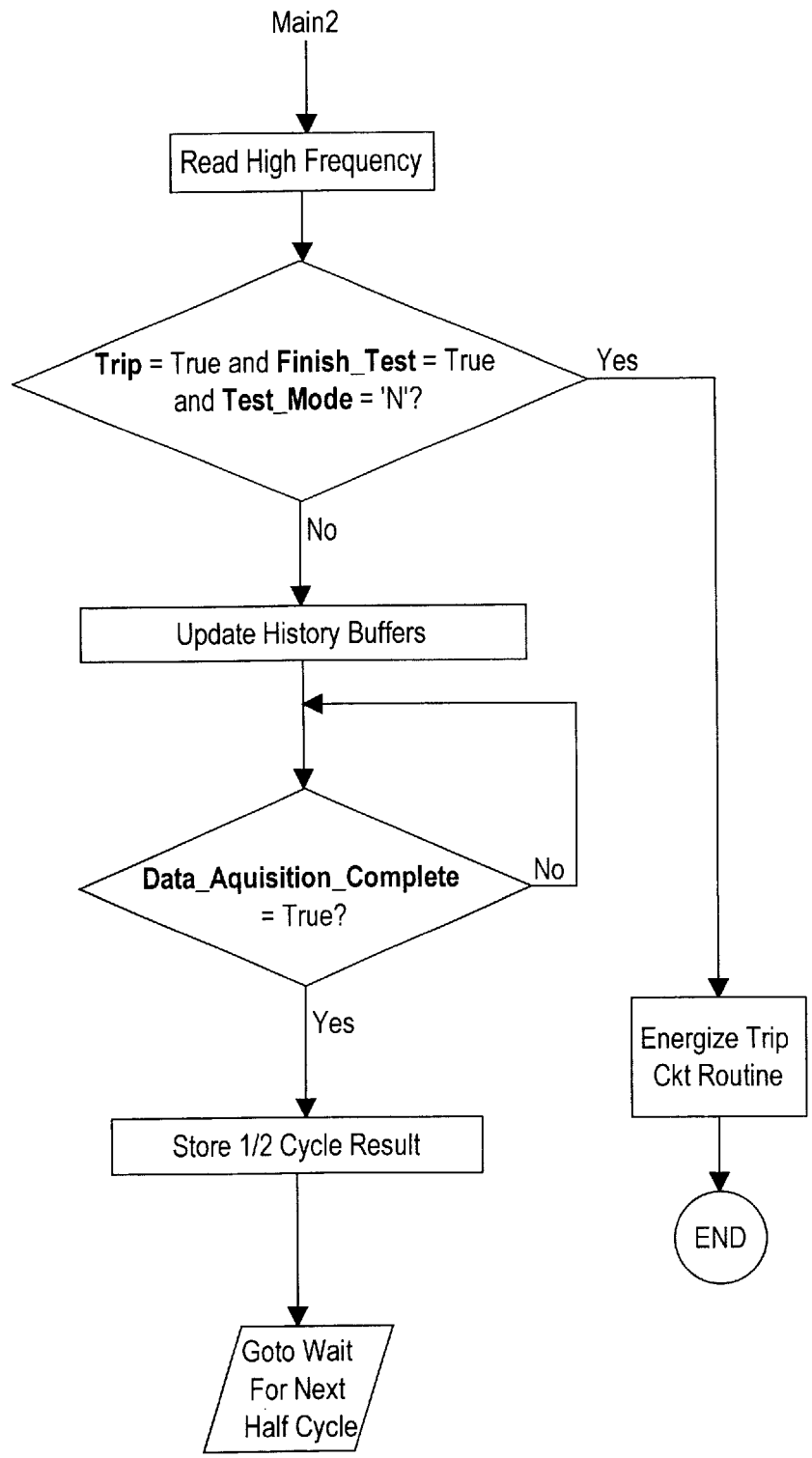

FIGS. 7a and 7b illustrate a main microcontroller routine including such subroutines as initializing of the initialized microcontroller 202, the setting of various null values for the ASIC (for example, Null_ASIC_Offset_204) illustrated and described above with reference to FIG. 1, and the setting of sample intervals. Additional subroutines include a self-test routine 208, a set sample interval routine 206, a start data acquisition routine 214, further details of which are shown in the following FIGS. 8–13. The arc detection algorithms 212 illustrated in FIG. 7a are further illustrated and described hereinabove with reference to FIGS. 2–6.

Figure 8:
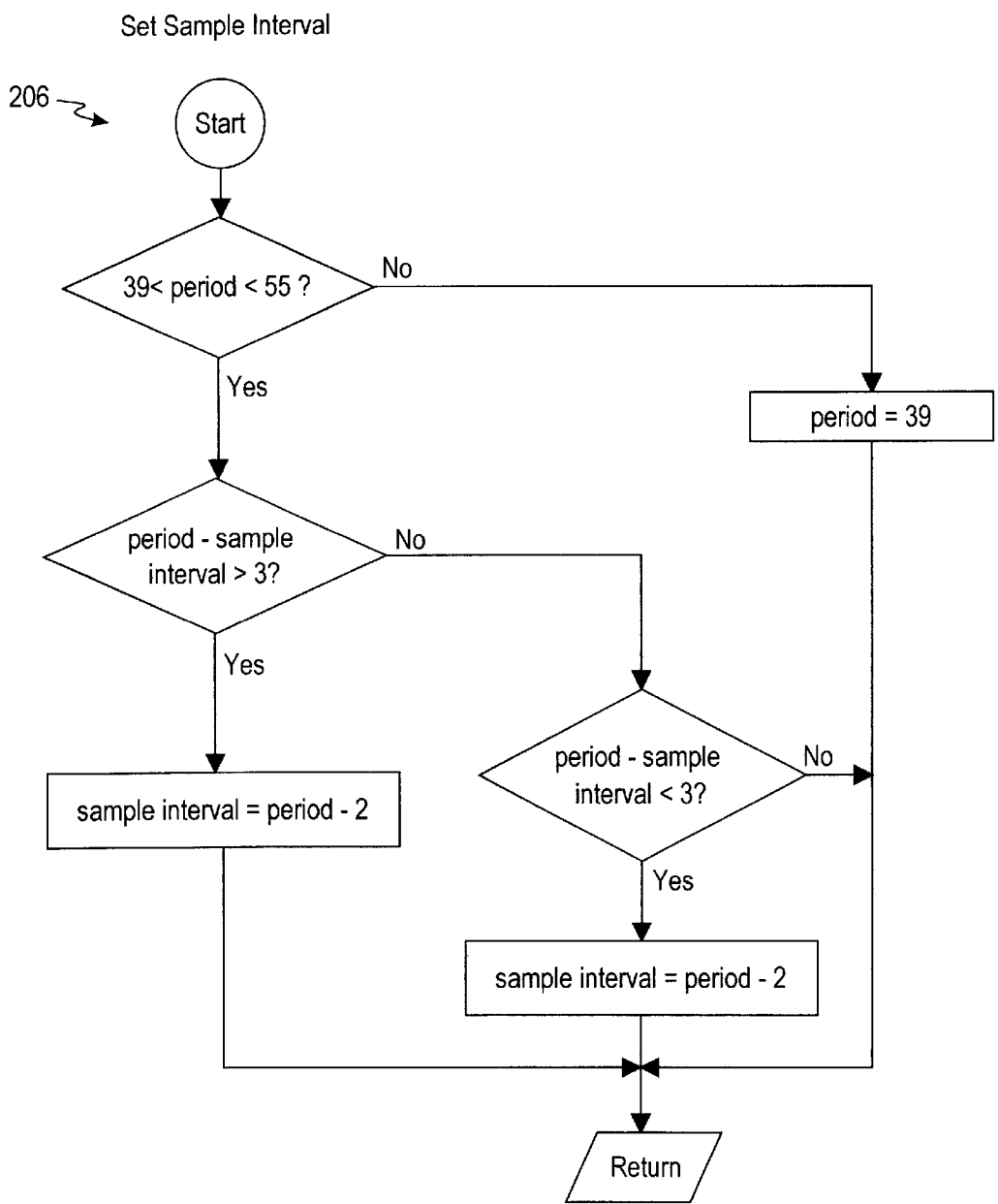
FIG. 8 illustrates an exemplary flow chart for a set sample interval routine.

FIG. 8 illustrates an exemplary flow chart for the set sample interval routine 206.

Figure 9A:
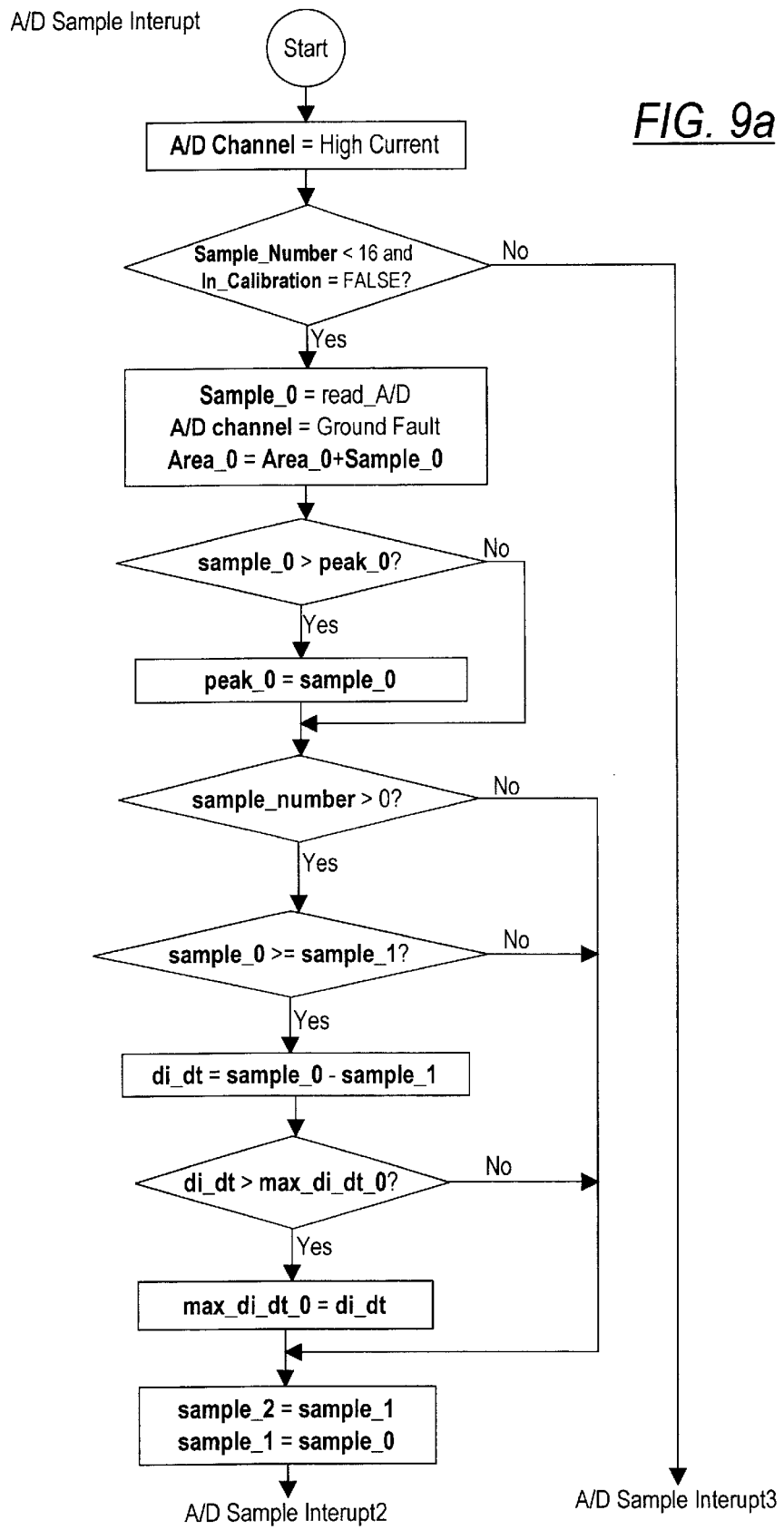
FIGS. 9a–9c show further details of an exemplary flow chart for an analog to digital (A/D) sample interrupt routine.
Figure 9B:
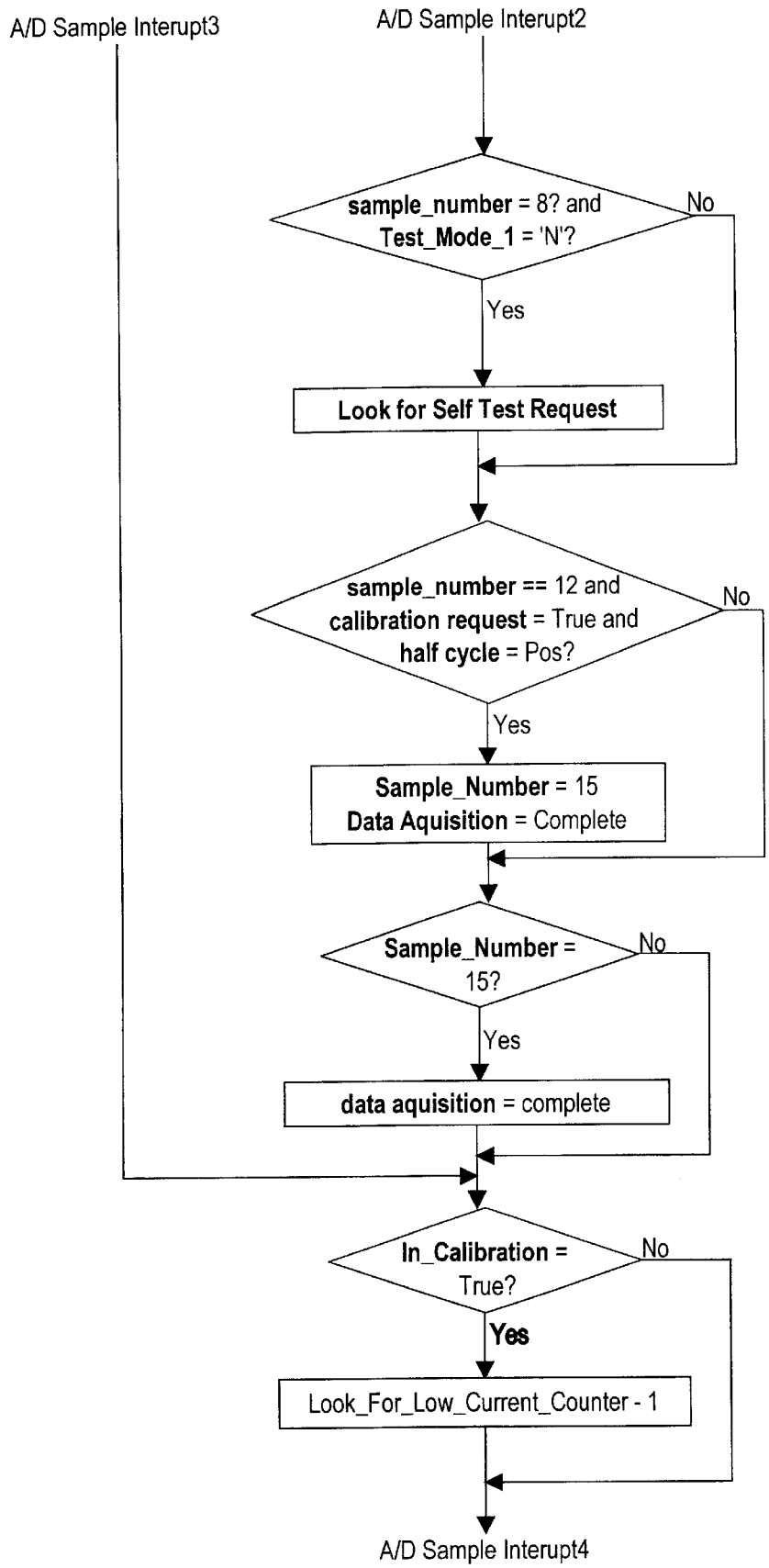
Figure 9C:
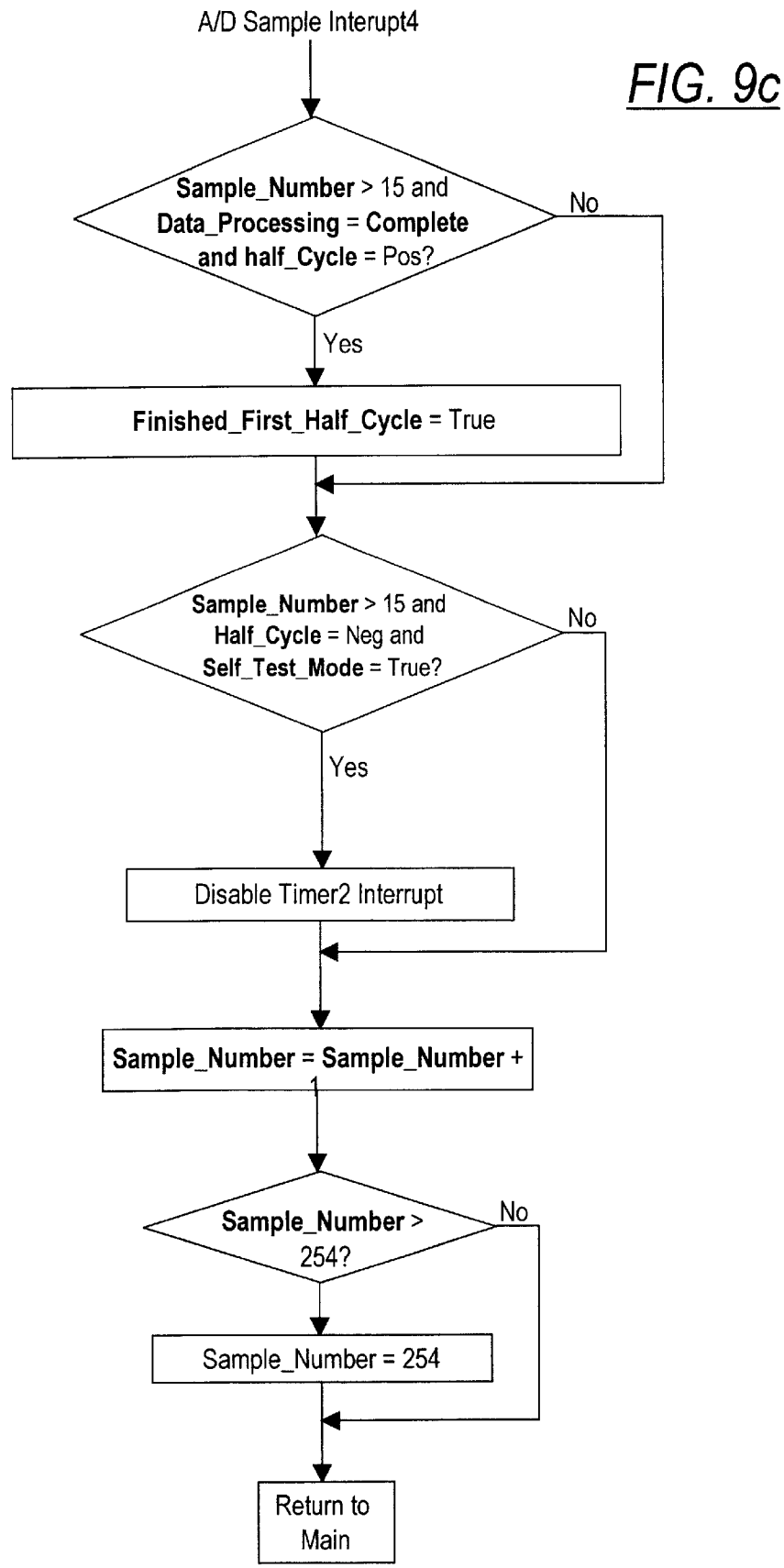

FIGS. 9a–c show further details of an exemplary flow chart for an analog to digital (A/D) sample interrupt routine.

Figure 10A:
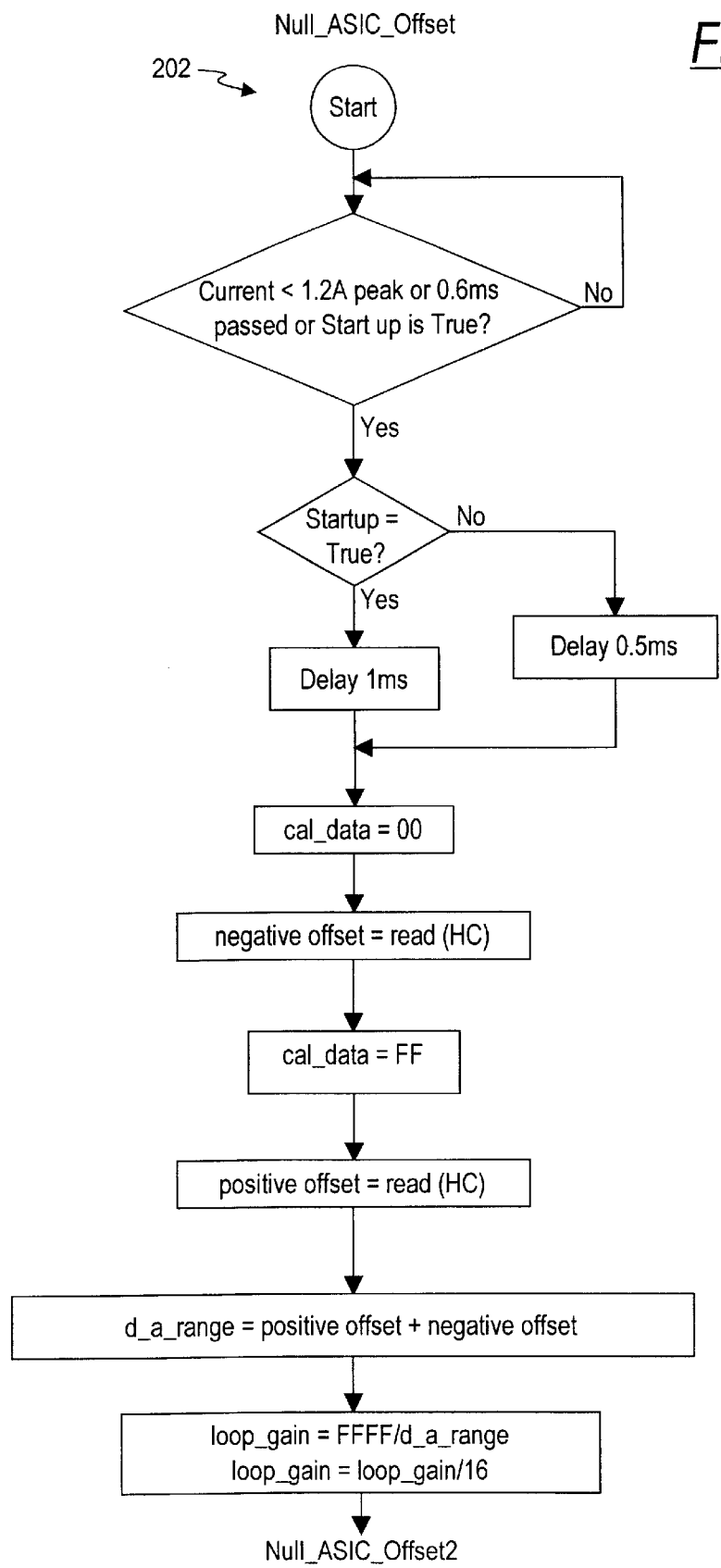
FIGS. 10a and 10b illustrate an exemplary flow chart for a null ASIC offset routine.
Figure 10B:
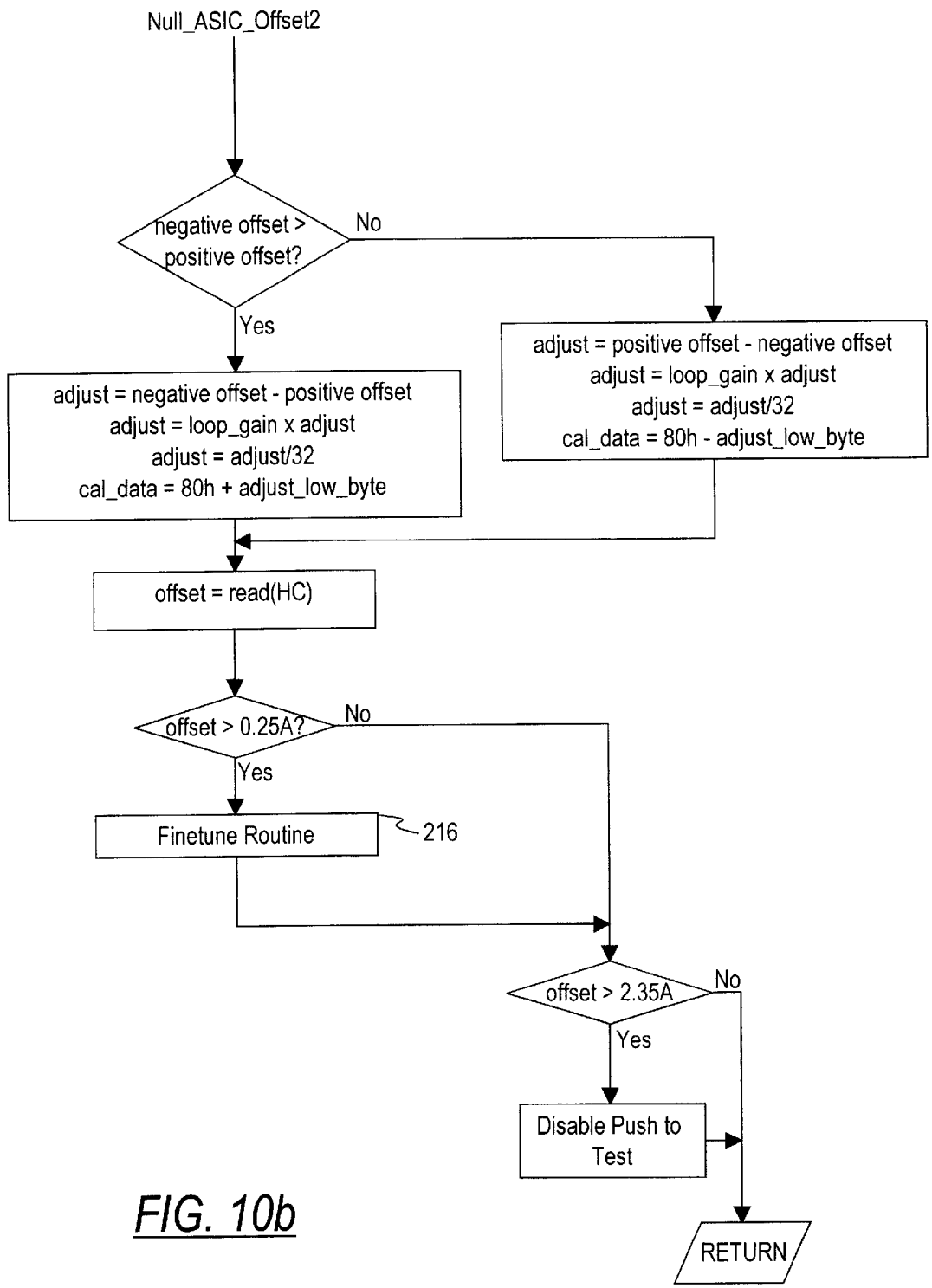

FIGS. 10a and 10b illustrate an exemplary flow chart for the null ASIC offset routine 202.

Figure 11:
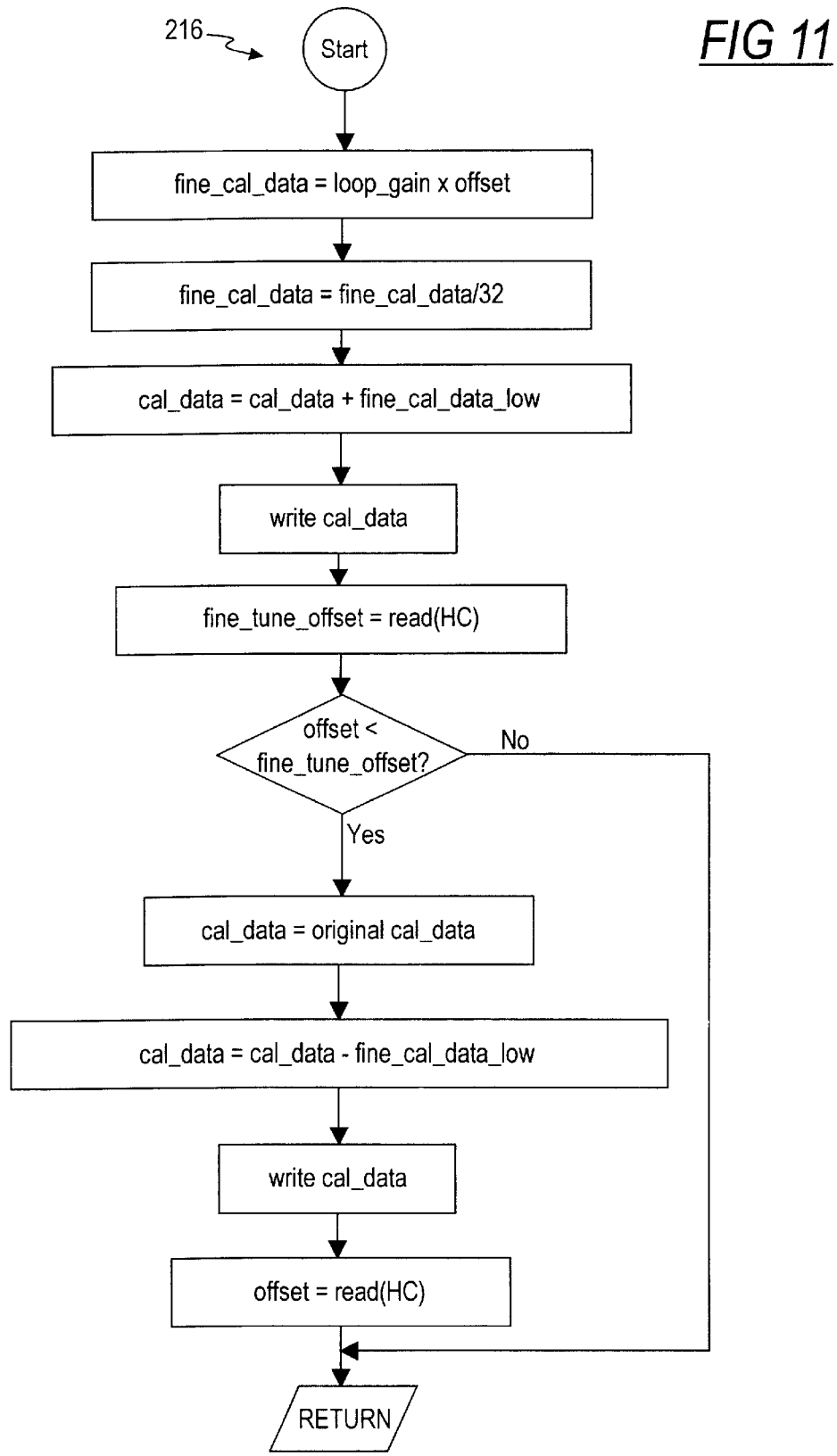
FIG. 11 is an exemplary flow chart for a fine tune routine of FIG. 10b.

FIG. 11 is an exemplary flow chart for a fine tune routine 216 of FIG. 10b.

Figure 12:
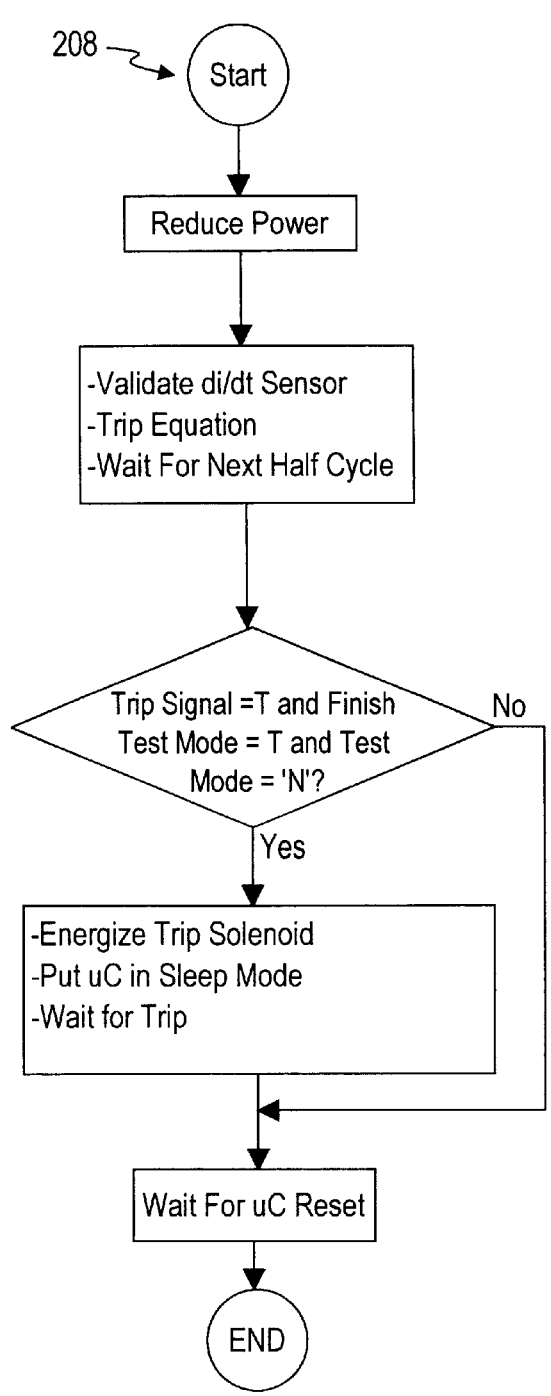
Figure 13:
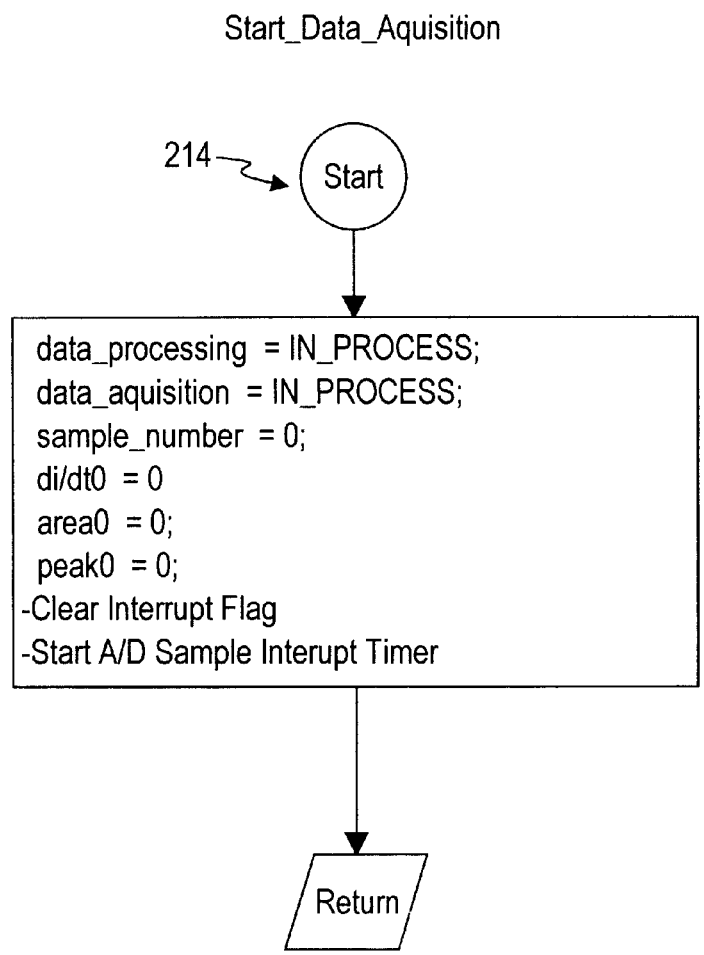

FIGS. 12 and 13 respectively show exemplary flow charts for the self-test and start data acquisition routines 208 and 214 of FIG. 7a.

In connection with the set sample interval routine 206 of FIG. 8, the period is the upper 8 bits of a word and is incremented every 400 nsec. from the rising edge of one voltage zero crossing to that of the next voltage zero crossing where it is reset and restarted. The sample interval is used to set the A to D sample period every line cycle.

With respect to the fine tune routine of FIG. 11, HC refers to the high current input. Fine cal data is a 16 bit quantity while fine cal data low refers to the lower 8 bits of the 16 bit quantity.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A method of determining whether arcing is present in an electrical circuit of an aircraft comprising:

sensing a current in said circuit and developing a corresponding sensor signal;

analyzing said sensor signal to determine the presence of broadband noise in said sensor signal and producing a corresponding output signal; and processing said sensor signal and said output signal in a predetermined fashion to determine current peaks, and to determine, using said current peaks and the presence of broadband noise, whether an arcing fault is present in said circuit, by comparing data corresponding to said current peaks and broadband noise with preselected data indicative of an arcing fault.

2. The method of claim 1 and further including producing a trip signal in response to a determination that an arcing fault is present in said circuit.

3. The method of claim 2 wherein said trip signal is produced under the following conditions:

if (Arcing_Half_Cycle_Count>6); or if (High_Current_Half_Cycles=3 within 0.5 seconds and Missing_Half_Cycle=TRUE and di/dt_Profile_Count>1 and Arcing_Half_Cycle_Count>1); or if (High_Current_Half_Cycles=4 within 0.5 seconds and Missing_Half_Cycle=TRUE and high Arcing_Half_Cycle_Count>2); or if (High_Current_Half_Cycles=5 within 0.5 seconds and Missing_Half_Cycle=TRUE and Arcing_Half_Cycle_Count>3); or if (High_Current_Half_Cycles=5 within 0.5 seconds and Arcing_Half_Cycle_Count>3 and di/dt1>di/dt3 and di/dt_Profile_Count>2); or if (High_Current_Half_Cycles=5 within 0.5 seconds and Arcing_Half_Cycle_Count>3 and di/dt1>di/dt3 and HF_Profile_Count>2 and di/dt_Profile_Count>1); or if (5<High_Current_Half_Cycles<9 within 0.5 seconds and Arcing_Half_Cycle_Count>3 and Missing_Half_Cycle=TRUE); or if (5<High_Current_Half_Cycles<9 within 0.5 seconds and Arcing_Half_Cycle_Count>3 and di/dt_Profile_Count>3); or if (5<High_Current_Half_Cycles<9 within 0.5 seconds and Arcing_Half_Cycle_Count>3 and HF_Profile_Count>1 and di/dt_Profile_Count>2); or if (5<High_Current_Half_Cycles<9 within 0.5 seconds and Arcing_Half_Cycle_Count>3 and HF_Profile_Count>2 and di/dt_Profile_Count>1);

wherein:

di/dt_Profile_Count—Holds the integer number of times di/dt has exceeded set thresholds;

a di/dt1 counter holds the maximum di/dt one half cycle ago;

a di/dt3 counter holds the maximum di/dt three half cycles ago;

High_Current_Half_Cycle—Holds the integer number of half cycles greater than 16A peak;

Arcing_Half_Cycle_Count—Holds the integer number of times an arcing half cycle was detected;

HF_Profile_Count—Holds the integer number of accumulated counts of broadband noise from previous half cycles; and Missing_Half_Cycle—Boolean variable set to TRUE when non-arcing follows arcing half cycle.

4. The method of claim 1 wherein said sensor signal comprises a di/dt signal corresponding to a change in current over time; and wherein said processing comprises incrementing a plurality of counters in response to said sensor signal and said output signal, and periodically determining whether an arcing fault is present by monitoring said plurality of counters and comparing counts in one or more of said counters with one or more preselected counts indicative of an arcing fault.

5. The method of claim 4 wherein if no arcing half cycle is detected in a predetermined amount of time after the last arcing half cycle, then all counters are cleared.

6. A system for determining whether arcing is present in an electrical circuit of an aircraft comprising:

a sensor which detects a current in said circuit and develops a corresponding sensor signal;

a detector which analyzes said sensor signal to determine the presence of broadband noise in said sensor signal and produces a corresponding output signal; and a controller which processes said sensor signal and said output signal to determine current peaks and to determine, using said current peaks and the presence of broadband noise, whether an arcing fault is present in said circuit by comparing data corresponding to said current peaks and broadband noise with preselected data indicative of an arcing fault.

7. The system of claim 6 wherein the controller produces a trip signal in response to a determination that an arcing fault is present in said circuit.

8. The system of claim 7 wherein said trip signal is produced under the following conditions:

if (Arcing_Half_Cycle_Count>6); or if (High_Current_Half_Cycles=3 within 0.5 seconds and Missing_Half_Cycle=TRUE and di/dt_Profile_Count>1 and Arcing_Half_Cycle_Count>1); or if (High_Current_Half_Cycles=4 within 0.5 seconds and Missing_Half_Cycle=TRUE and high Arcing_Half_Cycle_Count>2); or if (High_Current_Half_Cycles=5 within 0.5 seconds and Missing_Half_Cycle=TRUE and Arcing_Half_Cycle_Count>3); or if (High_Current_Half_Cycles=5 within 0.5 seconds and Arcing_Half_Cycle_Count>3 and di/dt1>di/dt3 and di/dt_Profile_Count>2); or if (High_Current_Half_Cycles=5 within 0.5 seconds and Arcing_Half_Cycle_Count>3 and di/dt1>di/dt3 and HF_Profile_Count>2 and di/dt_Profile_Count>1); or if (5<High_Current_Half_Cycles<9 within 0.5 seconds and Arcing_Half_Cycle_Count>3 and Missing_Half_Cycle=TRUE); or if (5<High_Current_Half_Cycles<9 within 0.5 seconds and Arcing_Half_Cycle_Count>3 and di/dt_Profile_Count>3); or if (5<High_Current_Half_Cycles<9 within 0.5 seconds and Arcing_Half_Cycle_Count>3 and HF_Profile_Count>1 and di/dt_Profile_Count>2); or if (5<High_Current_Half_Cycles<9 within 0.5 seconds and Arcing_Half_Cycle_Count>3 and HF_Profile_Count>2 and di/dt_Profile_Count>1);

wherein:
  di/dt_Profile_Count—Holds the integer number of times di/dt has exceeded set thresholds;
  a di/dt1 counter holds the maximum di/dt one half cycle ago;
  a di/dt3 counter holds the maximum di/dt three half cycles ago;
  High_Current_Half_Cycle—Holds the integer number of half cycles greater than 16A peak;
  Arcing_Half_Cycle_Count—Holds the integer number of times an arcing half cycle was detected;
  HF_Profile_Count—Holds the integer number of accumulated counts of broadband noise from previous half cycles; and
  Missing_Half_Cycle—Boolean variable set to TRUE when non-arcing follows arcing half cycle.

9. The system of claim 6 wherein the controller includes a plurality of counters and increments one or more of said plurality of counters in a predetermined fashion in accordance with said sensor signal and said output signal, and periodically determines whether an arcing fault is present upon the state of said plurality of counters, said sensor signal and said output signal.

10. The system of claim 9 wherein said plurality of counters are implemented in software.

11. The system of claim 9 wherein if no arcing half cycle is detected in a predetermined amount of time after the last arcing half cycle, then all counters are cleared by the controller.

12. The system of claim 6 and further including a voltage zero crossing detector coupled with said circuit and with said controller, and wherein said controller also processes voltage zero crossing information to determine whether an arcing fault is present in said circuit.

13. A controller for determining whether arcing is present in an electrical circuit in response to input signals, said input signals corresponding to a current in said circuit and to the presence of broadband noise in a predetermined range of frequencies in said circuit;

said controller including a plurality of counters and wherein said controller increments said plurality of counters in in response to said input signals and periodically determines whether an arcing fault is present by monitoring said plurality of counters and comparing counts in one or more of said counters with one or more preselected counts indicative of an arcing fault.

14. The controller of claim 13 wherein the controller further produces a trip signal in response to a determination that an arcing fault is present in said circuit.

15. The controller of claim 14 wherein said trip signal is produced under the following conditions:
  if (Arcing_Half_Cycle_Count>6); or
  if (High_Current_Half_Cycles=3 within 0.5 seconds and Missing_Half_Cycle=TRUE and di/dt_Profile_Count>1 and Arcing_Half_Cycle_Count>1); or
  if (High_Current_Half_Cycles=4 within 0.5 seconds and Missing_Half_Cycle=TRUE and high Arcing_Half_Cycle_Count>2); or
  if (High_Current_Half_Cycles=5 within 0.5 seconds and Missing_Half_Cycle=TRUE and Arcing_Half_Cycle_Count>3); or
  if (High_Current_Half_Cycles=5 within 0.5 seconds and Arcing_Half_Cycle_Count>3 and di/dt1>di/dt3 and di/dt_Profile_Count>2); or
  if (High_Current_Half_Cycles=5 within 0.5 seconds and Arcing_Half_Cycle_Count>3 and di/dt1>di/dt3 and HF_Profile_Count>2 and di/dt_Profile_Count>1); or
  if (5<High_Current_Half_Cycles<9 within 0.5 seconds and Arcing_Half_Cycle_Count>3 and Missing_Half_Cycle=TRUE); or
  if (5<High_Current_Half_Cycles<9 within 0.5 seconds and Arcing_Half_Cycle_Count>3 and di/dt_Profile_Count>3); or
  if (5<High_Current_Half_Cycles<9 within 0.5 seconds and Arcing_Half_Cycle_Count>3 and HF_Profile_Count>1 and di/dt_Profile_Count>2); or
  if (5<High_Current_Half_Cycles<9 within 0.5 seconds and Arcing_Half_Cycle_Count>3 and HF_Profile_Count>2 and di/dt_Profile_Count>1);
wherein:
  di/dt_Profile_Count—Holds the integer number of times di/dt has exceeded set thresholds;
  a di/dt1 counter holds the maximum di/dt one half cycle ago;
  a di/dt3 counter holds the maximum di/dt three half cycles ago;
  High_Current_Half_Cycle—Holds the integer number of half cycles greater than 16A peak;
  Arcing_Half_Cycle_Count—Holds the integer number of times an arcing half cycle was detected;
  HF_Profile_Count—Holds the integer number of accumulated counts of broadband noise from previous half cycles; and
  Missing_Half_Cycle—Boolean variable set to TRUE when non-arcing follows arcing half cycle.

16. The controller of claim 13 wherein said plurality of counters are implemented in software.

17. The controller of claim 13 wherein if no arcing half cycle is detected in a predetermined amount of time after the last arcing half cycle, then all counters are cleared.

18. A method of determining whether arcing is present in an electrical circuit of an aircraft in response to input signals, said input signals corresponding to a current in said circuit and to the presence of broadband noise in a predetermined range of frequencies in said circuit, said method comprising:
  incrementing a plurality of counters in response to said input signals; and
  periodically determining whether an arcing fault is present by monitoring said plurality of counters and comparing counts in one or more of said counters with one or more preselected counts indicative of an arcing fault.

19. The method of claim 18 and further including producing a trip signal in response to a determination that an arcing fault is present in said circuit.

20. The method of claim 19 wherein said trip signal is produced under the following conditions:
  if (Arcing_Half_Cycle_Count>6); or
  if (High_Current_Half_Cycles=3 within 0.5 seconds and Missing_Half_Cycle=TRUE and di/dt_Profile_Count>1 and Arcing_Half_Cycle_Count>1); or
  if (High_Current_Half_Cycles=4 within 0.5 seconds and Missing_Half_Cycle=TRUE and high Arcing_Half_Cycle_Count>2); or
  if (High_Current_Half_Cycles=5 within 0.5 seconds and Missing_Half_Cycle=TRUE and Arcing_Half_Cycle_Count>3); or
  if (High_Current_Half_Cycles=5 within 0.5 seconds and Arcing_Half_Cycle_Count>3 and di/dt1>di/dt3 and di/dt_Profile_Count>2); or
  if (High_Current_Half_Cycles=5 within 0.5 seconds and Arcing_Half_Cycle_Count>3 and di/dt1>di/dt3 and HF_Profile_Count>2 and di/dt_Profile_Count>1); or if (5<High_Current_Half_Cycles<9 within 0.5 seconds and Arcing_Half_Cycle_Count>3 and Missing>3 Half_Cycle=TRUE); or if (5<High_Current_Half_Cycles<9 within 0.5 seconds and Arcing_Half_Cycle_Count>3 and di/dt_Profile_Count>3); or if (5<High_Current_Half_Cycles<9 within 0.5 seconds and Arcing_Half_Cycle_Count>3 and HF_Profile_Count>1 and di/dt_Profile_Count>2); or if (5<High_Current_Half_Cycles<9 within 0.5 seconds and Arcing_Half_Cycle_Count>3 and HF_Profile_Count>2 and di/dt_Profile_Count>1);

wherein:

di/dt_Profile_Count—Holds the integer number of times di/dt has exceeded set thresholds;

a di/dt1 counter holds the maximum di/dt one half cycle ago;

a di/dt3 counter holds the maximum di/dt three half cycles ago;

High_Current_Half_Cycle—Holds the integer number of half cycles greater than 16A peak;

Arcing_Half_Cycle_Count—Holds the integer number of times an arcing half cycle was detected;

HF_Profile_Count—Holds the integer number of accumulated counts of broadband noise from previous half cycles; and Missing_Half_Cycle—Boolean variable set to TRUE when non-arcing follows arcing half cycle.

21. The method of claim 18 wherein if no arcing half cycle is detected in a predetermined amount of time after the last arcing half cycle, then all counters are cleared.

* * * * *